(12) United States Patent
Kamon

(10) Patent No.: US 6,228,542 B1
(45) Date of Patent: May 8, 2001

(54) PHOTOMASK METHOD OF MANUFACTURE METHOD OF TEST/REPAIR AND METHOD OF USE THEREFOR

(75) Inventor: Kazuya Kamon, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/347,272

(22) Filed: Jul. 6, 1999

(30) Foreign Application Priority Data

Feb. 19, 1999 (JP) .................................. 11-042230

(51) Int. Cl.$^7$ ................ G03F 9/00; G03C 5/00; C09K 19/00
(52) U.S. Cl. .................. 430/5; 430/311; 430/20
(58) Field of Search .................. 430/5, 20, 322, 430/296, 311; 359/500.22

(56) References Cited

FOREIGN PATENT DOCUMENTS 9-34097   2/1997   (JP) .

*Primary Examiner*—S. Rosasco
(74) *Attorney, Agent, or Firm*—Burns, Doane, Swecker & Mathis, LLP

(57) ABSTRACT

The present invention is proposed to solve the problem of conspicuous increases in the drawing time of a circuit pattern when oblique lines are present which leads to high costs and low accuracy for resulting photomasks. For this reason, a shading pattern 3*b* formed on the principal plane of a transparent base 2 based on layout data of a circuit pattern of a polygon containing a oblique line is converted to polygon data in which a oblique line is expressed in a stepwise form by a number Np of rectangles which are defined by Np=int (W/Rp/m), where W is a width which is the width of the oblique lines, Rp is a resolution of a projection exposure apparatus and m is a magnification of a projection exposure apparatus. The shading pattern 3*b* is formed on the principal plane of the transparent substrate 2 based on layout data of a circuit pattern of a polygon containing a oblique line.

22 Claims, 16 Drawing Sheets

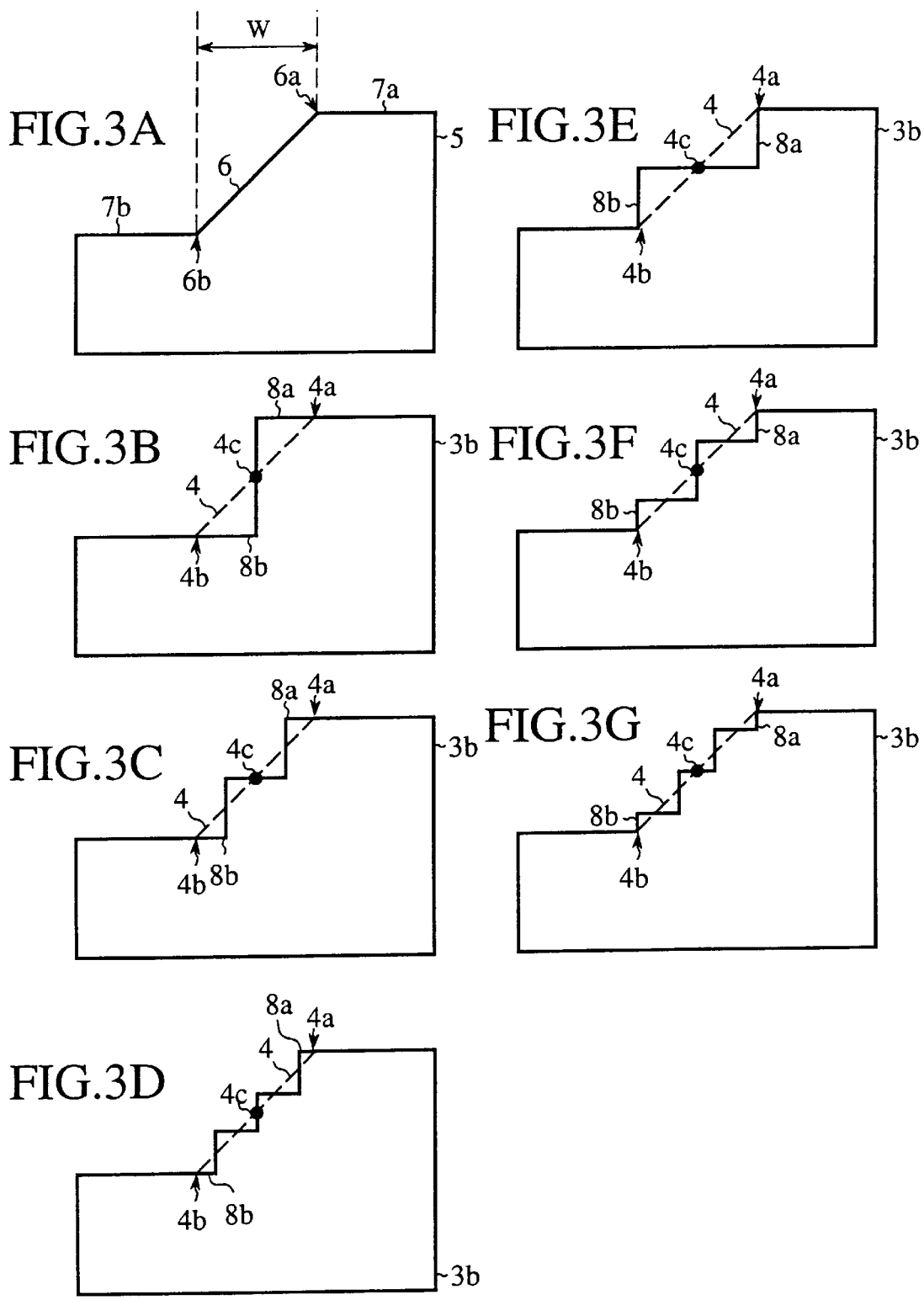

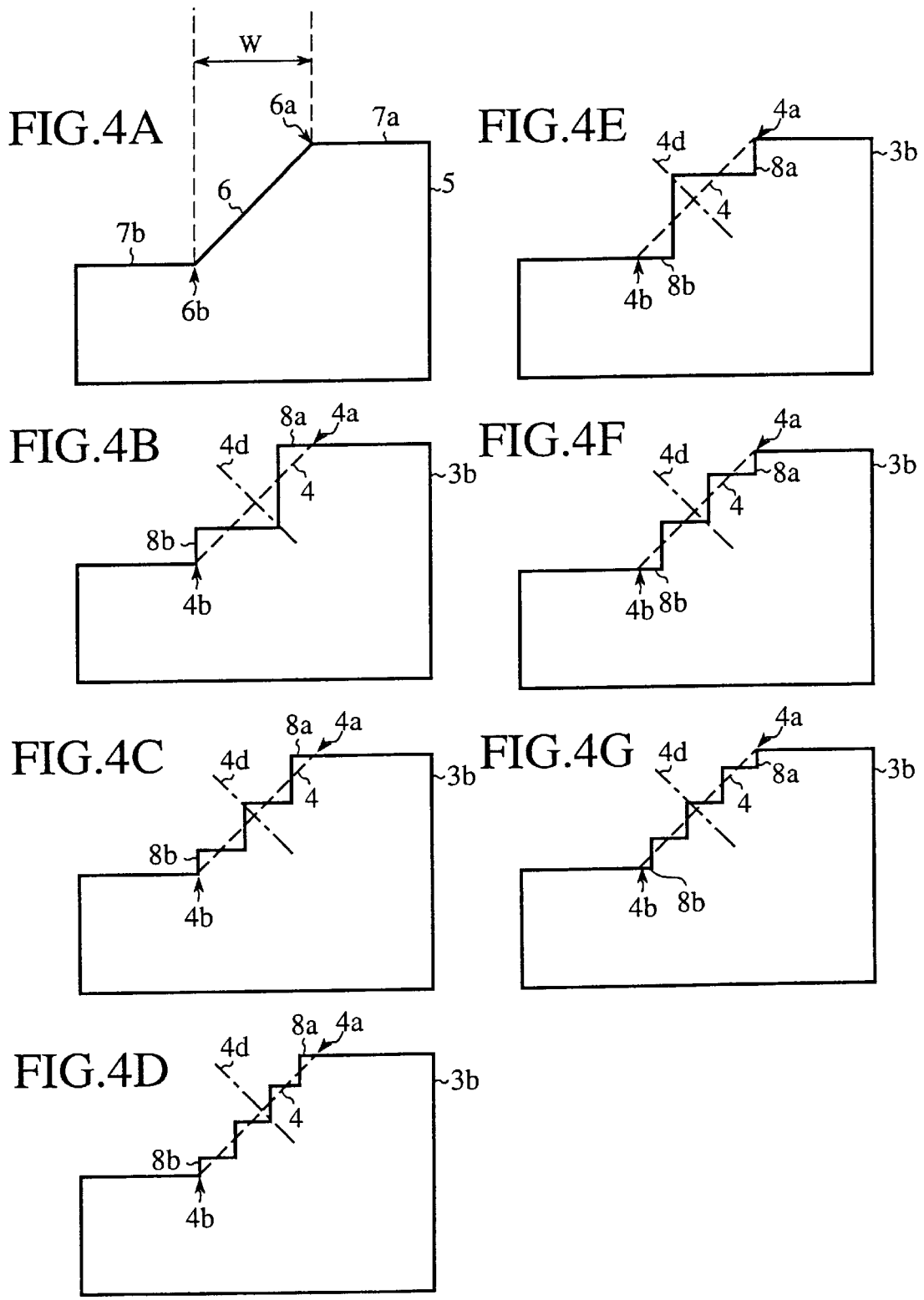

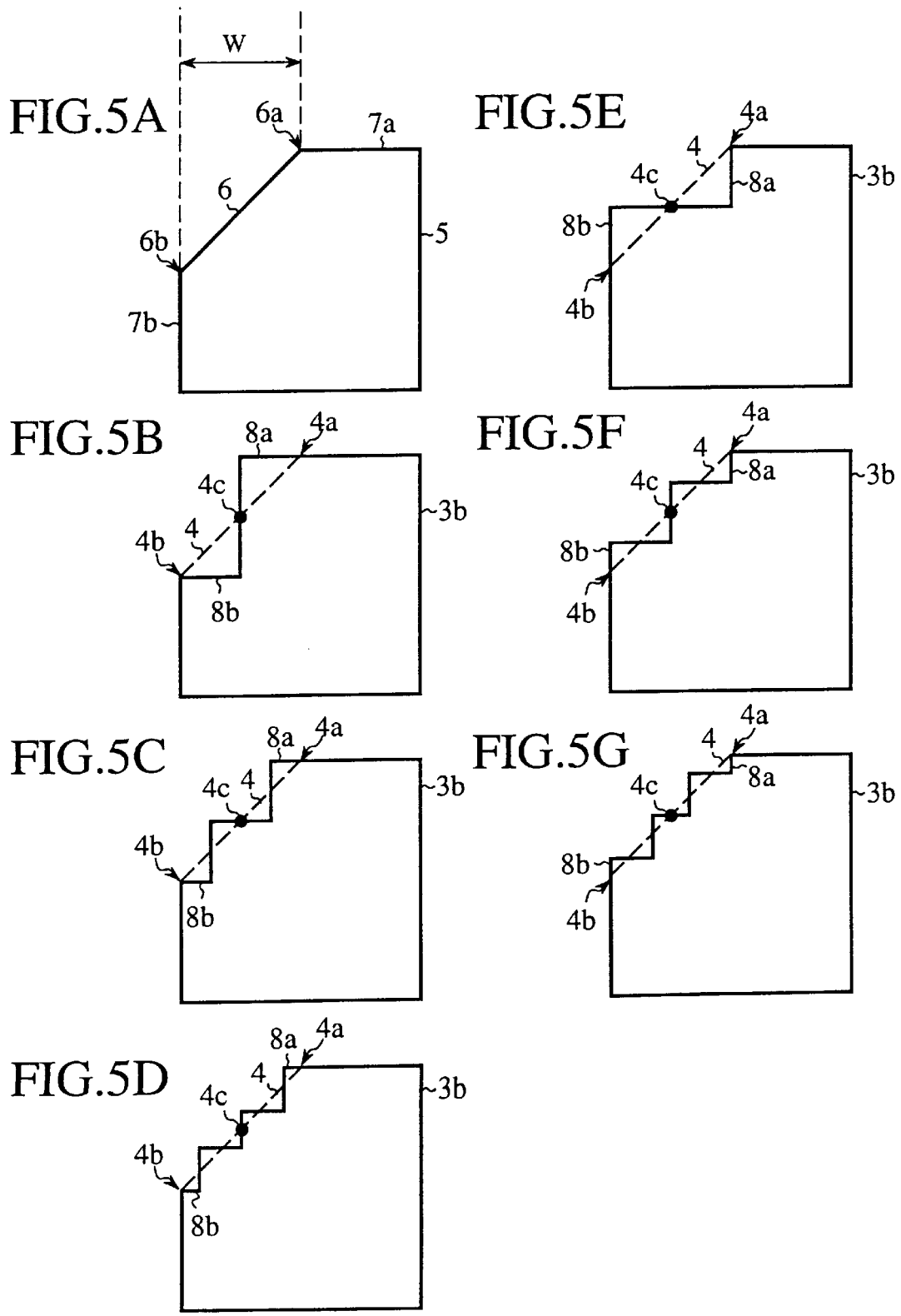

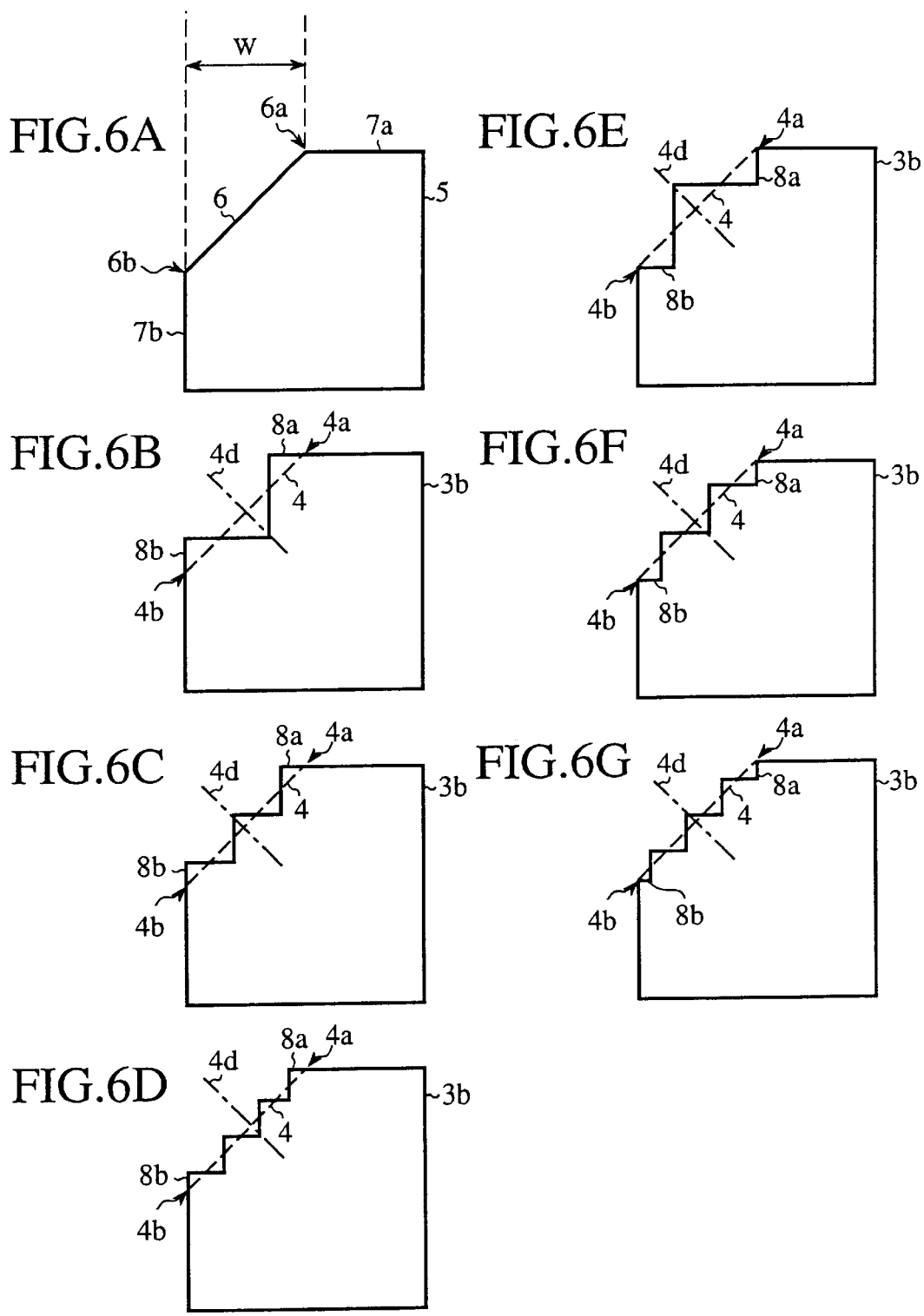

FIG.14A  *PRIOR ART*
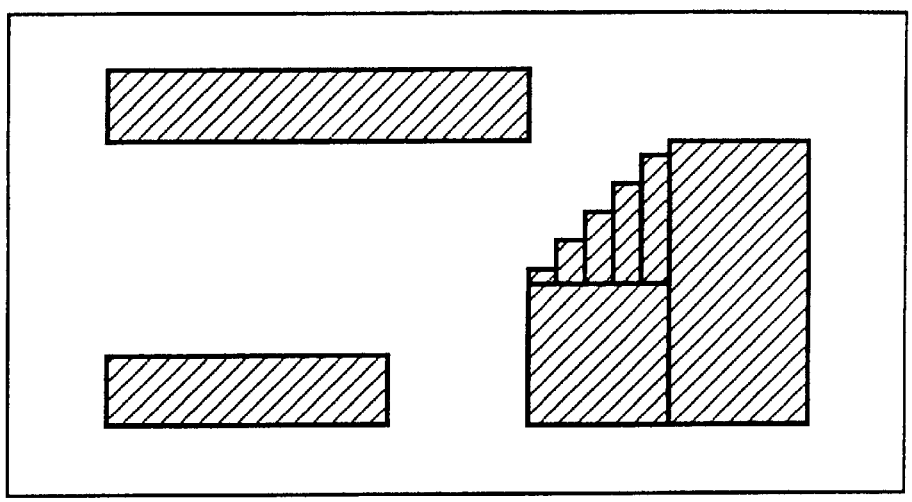
FIG.14B  *PRIOR ART*
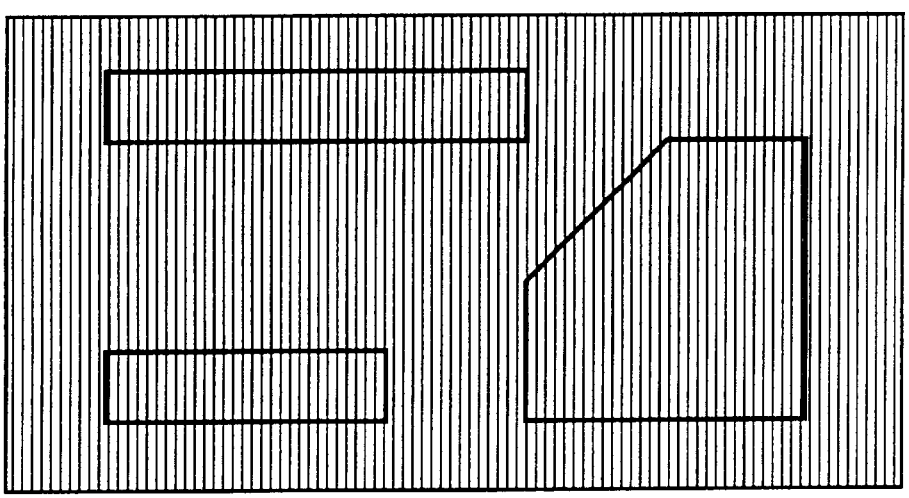
FIG.14C  *PRIOR ART*
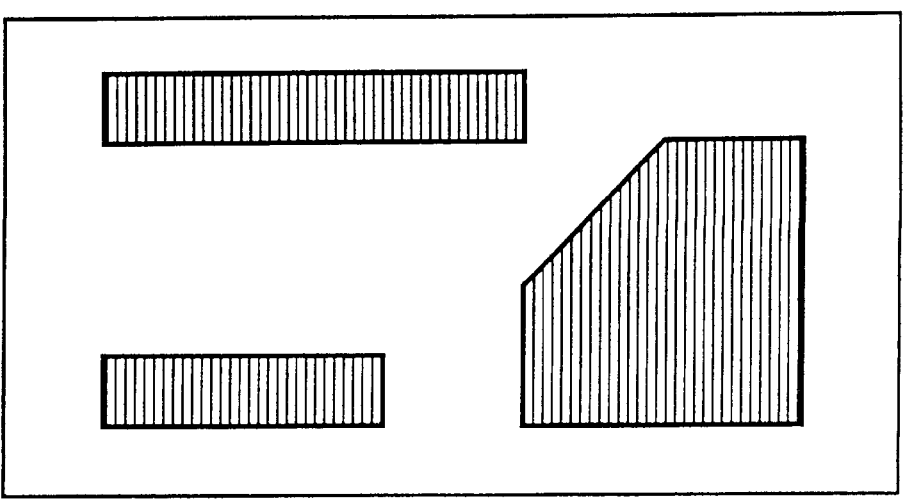

FIG.16A *PRIOR ART* 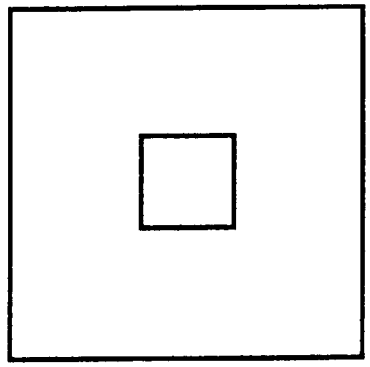 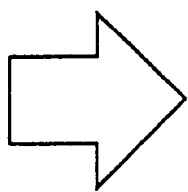 FIG.16B *PRIOR ART* 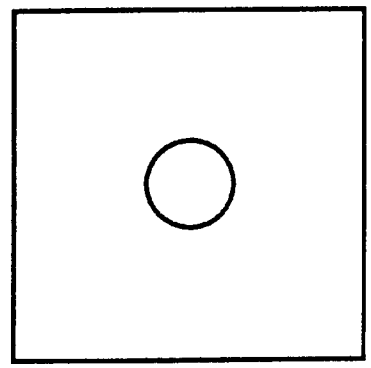

PHOTOMASK METHOD OF MANUFACTURE METHOD OF TEST/REPAIR AND METHOD OF USE THEREFOR

BACKGROUND OF THE INVENTION

1. Field of the Invention

The present invention relates to a photomask which is used in the manufacturing process of semiconductor integrated circuit device or a liquid crystal display, as well as a method of test/repairing, of manufacturing and of using said photomask.

2. Description of the Prior Art

Recent years have witnessed increased use of electron beam exposure apparatus of a variable shaped beam vector scan type in the manufacture of photomasks.

FIG. 13 is a schematic diagram of an electron beam exposure apparatus of a variable shaped beam vector scan type. In FIG. 13, 101 is an electron beam exposure apparatus of a variable shaped beam vector scan type. 102 is a $LaB_6$ electron gun, 103 is a first shaping aperture, 104 is a first shaping lens, 105 is a first shaping deflector, 106 is a second shaping lens, 107 is a second shaping lens, 108 is a reducing lens, 109 is a blanking electrode, 110 is a deflector, 111 is a condenser lens, and 112 is a drawing field.

113 is a variable shaped lens which comprises the first shaping aperture 103, the first shaping lens 104, the first shaping deflector 105, the second shaping lens 106, and the second shaping lens 107. 114 is a convergent reflecting lens which comprises the deflector 110 and the condenser lens 111. 115 is a photomask which acts as the object to be exposed and which is placed on a stage (not shown).

As shown in FIG. 14A, when the electron beam exposure apparatus of a variable shaped beam vector scan type 101 is drawing circuit patterns, a method is used by which the layout data for the circuit pattern is separated into simple rectangles and each rectangle is exposed in order. As a result, the electron beam exposure device of a variable shaped beam vector scan type 101 displays high throughput when the layout of circuit patterns is simple in comparison to a complicated circuit pattern layout. This is because a simple circuit pattern layout ensures that the number of rectangles to be exposed is small even if the area to be exposed in the same.

Furthermore the electronic beam exposure apparatus of a variable shaped beam vector scan type 101 displays considerable advances in throughput in comparison with electron beam exposure devices of the following types:

electron beam exposure devices of a Gaussian beam raster scan type as shown in FIG. 14B which are adapted to use a method of drawing a circuit pattern by scanning the entire photomask, including sections to be exposed and sections not to be exposed with a Gaussian beam or electron beam exposure apparatus of a Gaussian beam vector scan type which are adapted to use a method of drawing a circuit pattern by scanning only those sections which will be exposed with a Gaussian beam as shown in FIG. 14C.

In recent years, due to the attempt to pack complicated functions in a small area which is associated with the highly integrated LSI circuits, the tendency to use wiring which runs in a curved direction is increasing as the degree of freedom with wiring running only in crosswise directions is small.

However the electron beam exposure apparatus of a variable shaped beam vector scan type 101 is not comprised of first and second shaping sections which can draw curved lines. Thus when the electron beam exposure apparatus of a variable shaped beam vector scan type 101 draws circuit patterns for polygons containing oblique lines, firstly as shown in FIG. 14A, layout data for circuit patterns of polygons which contain oblique lines are converted to polygon data, the entirety of which is formed by a plurality of rectangles and in which oblique lines are represented in stepwise form by a plurality of long thin rectangles which have the same resolution as the electron beam exposure device 101. In other words, the width W of a oblique line is set so as to equal an integer multiple of the resolution Rw of the electron beam exposure device 101. Layout data for polygon circuit patterns containing oblique lines are converted to polygon data, the entirety of which is formed from a plurality of rectangles and in which a curved line is represented in a stepwise manner by a number Nw of individual rectangles defined as Nw=W/Rw. Thereafter polygon circuit patterns containing oblique lines are drawn by exposing the rectangles one at a time.

When the layout data is evenly compressed, rectangular layout data can be accurately placed on a grid. It is not certain however that layout data for polygons containing oblique lines can be accurately placed on a grid. When layout data can not be placed accurately on a grid after shrinkage, a rounding-off error is generated in the layout data which results in reduced drawing accuracy.

FIG. 15 is a projection exposure apparatus for the manufacture of liquid crystal displays or semiconductor integrated circuit devices using a photomask which is manufactured using an electron beam exposure apparatus. In FIG. 15, 201 is a projection exposure apparatus, 202 is an Hg lamp which is used as a light source, 203 is a first lens, 204 is a first mirror, 205 is a second lens, 206 is a fly's eye lens, 207 is a two dimensional light source, 208 is a third lens, 209 is a blind, 210 is a fourth lens, 211 is a second mirror, 212 is a fifth lens, 213 is a sixth lens, 214 is a pupil plane, 215 is a seventh lens.

216 is a photomask, 217 is a wafer which acts as a object to be exposed, 218 is light which is emitted from the Hg lamp, 219 is diffracted light which is diffracted by the photomask 216.

The resolution Rp of the projection exposure apparatus 201 is defined as Rp=k1·λ/NA where λ is an exposure wavelength, NA is a number of lens apertures and k1 is a process constant. As a result, shading patterns can not be accurately displayed on a wafer 217 which acts as an object to be exposed when the width of the shading pattern which is formed on the principal plane of the photomask 216 is below m·Rp and the outline is curled. For example, a wafer 217 is exposed by mounting a photomask as shown in FIG. 16A into a projection exposure device as shown in FIG. 15. In the center of the photomask, a shading pattern is provided with a square hole one edge of which is below m·Rp. In the above situation, the shape of the shading pattern on the wafer 217 is of the shape as in FIG. 16B.

The above process is executed when oblique lines are drawn using an electron beam exposure apparatus of a variable shape beam vector type. Thus when oblique lines are present in the circuit pattern, the period of time required to draw the circuit patterns is conspicuously lengthened, the throughput of the electron beam exposure apparatus deteriorates and the cost of the photomask increases.

Furthermore increases in the period of time for drawing result in large increases in the drift of the stage of the electron beam exposure apparatus. Dimensional errors are increased and the accuracy of the photomask is reduced.

SUMMARY OF THE INVENTION

The present invention is proposed to solve the problems outlined above and has the object of providing a highly accurate photomask at a low cost.

It is a further object of the present invention to provide a method of manufacture, a method of test/repairing and a method of use for such a photomask.

In a first embodiment of the invention, a photomask is provided with a transparent substrate, and a shading pattern which displays polygon circuit patterns containing oblique lines as polygons in which the oblique lines are represented in a stepwise pattern of a plurality of rectangles. The width R of the rectangles is in the range $Rw<R<Rp \cdot m$ (where m is a magnification of the exposure apparatus, Rp is a resolution of the exposure apparatus and Rw is a resolution of the mask drawing apparatus).

In a first embodiment of the invention, since a photomask is provided with a transparent substrate, and a shading pattern which displays polygon circuit patterns containing oblique lines as polygons in which the oblique lines are represented in stepwise patterns of a plurality of rectangles wherein the width R of the rectangles is in the range $Rw<R<Rp \cdot m$ (where m is a magnification of the exposure apparatus, Rp is a resolution of the exposure apparatus and Rw is a resolution of the mask drawing device), a highly accurate and low cost photomask is obtained.

In a second embodiment of the invention, the area of polygons containing oblique lines in the photomask is equal to the area of polygons in which the oblique lines are represented in a stepwise fashion.

In a second embodiment of the invention, since the area of polygons containing oblique lines in the photomask is equal to the area of polygons in which oblique lines are represented in stepwise fashion, when the photomask is housed in an exposure apparatus and a wafer is exposed, it is possible to perform accurate projection of the circuit pattern onto the wafer.

According to a third embodiment of the invention, the edge of the photomask which contacts with the end of the oblique line in a polygon containing oblique lines has a parallel relationship with the edge which contacts with a position corresponding to the end of the oblique line in a polygon in which oblique lines are represented in a stepwise manner.

According to a third embodiment of the invention, since the edge of the photomask which contacts with the end of the oblique line in a polygon containing oblique lines has a parallel relationship with the edge which contacts with a position corresponding to the end of the oblique line in a polygon in which oblique lines are represented in a stepwise manner, when the photomask is housed in an exposure apparatus and a wafer is exposed, it is possible to perform highly accurate projection of the circuit pattern onto the wafer.

According to a fourth embodiment of the invention, the edge of the photomask which contacts with the end of the oblique line of a polygon which contains oblique lines has an orthogonal relationship with the edge which contacts with a position which corresponds to the end of a oblique line in a polygon in which oblique lines are represented in a stepwise manner.

According to a fourth embodiment of the invention, since the edge of the photomask which contacts with the end of the oblique line of a polygon which contains oblique lines has an orthogonal relationship with the edge which connects with a position which corresponds to the end of a oblique line in a polygon in which oblique lines are represented in a stepwise manner, when the photomask is housed in an exposure apparatus and a wafer is exposed, it is possible to perform highly accurate projection of the circuit pattern onto the wafer.

According to a fifth embodiment of the present invention, when the edges of the photomask, which are in contact with the end of a oblique line in a polygon which contains oblique lines, are mutually parallel, the stepwise shape expressing a oblique line displays point symmetry with respect to the middle point of the line which corresponds with the oblique line.

According to a fifth embodiment of the present invention, since the stepwise shape expressing the oblique line displays point symmetry with respect to the middle point of the line which corresponds with a oblique line, when the edges of the photomask, which are in contact with the end of the oblique line in a polygon which contains oblique lines, are mutually parallel, when the photomask is housed in an exposure apparatus and a wafer is exposed, it is possible to perform highly accurate projection of the circuit pattern onto the wafer.

According to a sixth embodiment of the invention, when the edges of the photomask, which are in contact with the end of a oblique line in a polygon which contains curved lines, are mutually parallel, the stepwise shape which expresses a oblique line displays mirror symmetry with respect to a vertical bisector of the line which corresponds to the oblique line.

According to a sixth embodiment of the invention, since the stepwise shape which expresses a oblique line displays mirror symmetry with respect to a vertical bisector of the line which corresponds to the oblique line, when the edges of the photomask, which are in contact with the end of a oblique line in a polygon which contains oblique lines, are mutually parallel, when the photomask is housed in an exposure apparatus and a wafer is exposed, it is possible to perform highly accurate projection of the circuit pattern onto the wafer.

According to a seventh embodiment of the invention, when the edges of the photomask, which are in contact with the end of the oblique line in a polygon which contains oblique lines, are mutually orthogonal, the stepwise shape which expresses a oblique line displays point symmetry with respect to a middle point of the line which corresponds to the oblique line.

According to a seventh embodiment of the invention, since the stepwise shape which expresses a oblique line displays point symmetry with respect to a middle point of the line which corresponds to the oblique line, when the edges of the photomask, which are in contact with the end of the oblique line in a polygon which contains curved lines, are mutually orthogonal, when the photomask is housed in an exposure apparatus and a wafer is exposed, it is possible to perform highly accurate projection of the circuit pattern onto the wafer.

According to an eighth embodiment of the invention, when the edges of the photomask, which are in contact with the end of a oblique line in a polygon which contains oblique lines, are mutually orthogonal, the stepwise shape which expresses a oblique line display mirror symmetry with respect to a vertical bisector of the line which corresponds to the oblique line.

According to an eighth embodiment of the invention, since the stepwise shape which expresses a oblique line displays mirror symmetry with respect to a vertical bisector of the line which corresponds to the oblique line, when the edges of the photomask, which are in contact with the end of the oblique line in a polygon which contains oblique lines, are mutually orthogonal, when the photomask is housed in an exposure apparatus and a wafer is exposed, it is possible to perform highly accurate projection of the circuit pattern onto the wafer.

According to a ninth embodiment of the invention, a method of manufacturing the photomask comprises a step of laying out a circuit pattern and producing layout data therefor, a step of converting layout data for a circuit pattern of a polygon containing a oblique line into polygon data the entirety of which is formed by a plurality of rectangles and in which oblique lines are expressed in a step pattern by a plurality of rectangles, a step of drawing a circuit pattern based on layout data after conversion of the circuit pattern of a polygon containing oblique lines, and further in said step of converting layout data of the circuit pattern of a polygon containing a oblique line, a width R of a rectangle which expresses a oblique line is in the range of Rw<R<Rp·m (where m is the magnification of the exposure apparatus, Rp is the resolution of the exposure apparatus and Rw is the resolution of the mask writer).

According to a ninth embodiment of the invention, since a method of manufacturing the photomask comprises a step of laying out a circuit pattern and producing layout data therefor, a step of converting layout data for a circuit pattern of a polygon containing a oblique line into polygon data the entirety of which is formed by a plurality of rectangles and in which oblique lines are expressed in a step pattern by a plurality of rectangles, a step of drawing a circuit pattern based on layout data after conversion of the circuit pattern of a polygon containing oblique lines, and further in said step of converting layout data of the circuit pattern of a polygon containing a oblique line, a width R of a rectangle which expresses a oblique line is in the range of Rw<R<Rp·m (where m is the magnification of the exposure apparatus, Rp is the resolution of the exposure apparatus and Rw is the resolution of the mask drawing apparatus), it is possible to manufacture highly accurate photomasks at a low cost.

According to a tenth embodiment of the invention, a method of manufacturing a photomask selects a method in which the number of rectangles is small when there exists multiple ways of converting layout data of circuit patterns for polygons which contain oblique lines According to a tenth embodiment of the invention, since a method of manufacturing a photomask selects a method in which the total number of rectangles is small when there exists multiple ways of converting layout data of circuit patterns for polygons which contain oblique lines, it is possible to manufacture highly accurate photomasks at a low cost.

According to an eleventh embodiment of the invention, a method of manufacturing a photomask selects a method in which the number of minute rectangles is small when there exists multiple ways of converting layout data of circuit patterns for rectangles which contain oblique lines.

According to an eleventh embodiment of the invention, since a method of manufacturing a photomask selects a method in which the total number of minute rectangles is small when there exists multiple ways of converting layout data of circuit patterns for rectangles which contain oblique lines, it is possible to manufacture photomasks with highly accurate shading patterns.

According to a twelfth embodiment of the invention, a method of manufacturing a photomask selects a method in which a minute rectangle is not positioned in the outer periphery of the polygon which is comprised by a plurality of rectangles when there exists multiple ways of converting layout data of circuit patterns for rectangles which contain oblique lines.

According to a twelfth embodiment of the invention, since a method of manufacturing a photomask selects a method in which a minute rectangle is not positioned in the outer periphery of the polygon which is comprised by a plurality of rectangles when there exists multiple ways of converting layout data of circuit patterns for rectangles which contain oblique lines, it is possible to manufacture photomasks which have highly accurate shading patterns.

According to a thirteenth embodiment, a method of test/repairing a photomask comprises testing and repairing a oblique with reference to circuit pattern layout data when a defect is tested and repaired. Such a defect is generated at a position on a line which corresponds to a oblique line of a photomask which comprises a transparent base and a shading pattern which shows a circuit pattern of a polygon containing oblique lines as a polygon in which oblique lines are expressed by a stepwise pattern of a plurality of rectangles, and in which a width B of rectangles which express a oblique line is in the range of Rw<R<Rp·m (where m is the magnification of the exposure apparatus, Rp is the resolution of the exposure apparatus and Rw is the resolution of the mask drawing apparatus).

With the above arrangement, it is possible to manufacture a highly reliable semiconductor integrated circuit at a low cost.

According to a fourteenth embodiment, a method of using a photomask comprises manufacturing a semiconductor integrated circuit using a photomask which comprises a transparent base and a shading pattern which shows a circuit pattern of a polygon containing oblique lines as a polygon in which oblique lines are expressed by a stepwise pattern of a plurality of rectangles, and in which a width R of rectangles which express a oblique line is in the range of Rw<R<Rp·m (where m is the magnification of the exposure apparatus, Rp is the resolution of the exposure apparatus and Rw is the resolution of the mask drawing apparatus).

According to a fourteenth embodiment, since a method of using a photomask comprises manufacturing a semiconductor integrated circuit using a photomask which comprises a transparent substrate and a shading pattern which shows a circuit pattern of a polygon containing oblique lines as a polygon in which oblique lines are expressed by a stepwise pattern of a plurality of rectangles, and in which a width R of rectangles which express a oblique line is in the range of Rw<R<Rp·m (where m is the magnification of the exposure apparatus, Rp is the resolution of the exposure apparatus and Rw is the resolution of the mask drawing apparatus), it is possible to manufacture a semiconductor integrated circuit with high reliability at a low cost.

According to a fifteenth embodiment, a method of using a photomask comprises manufacturing a liquid crystal display using a photomask which comprises a transparent base and a shading pattern which shows a circuit pattern of a polygon containing oblique lines as a polygon in which oblique lines are expressed by a stepwise pattern of a plurality of rectangles, and in which a width R of rectangles which express a oblique line is in the range of Rw<R<Rp·m (where m is the magnification of the exposure apparatus, Rp is the resolution of the exposure apparatus and Rw is the resolution of the mask drawing apparatus).

According to a fifteenth embodiment, since a method of using a photomask comprises manufacturing a liquid crystal display using a photomask which comprises a transparent base and a shading pattern which shows a circuit pattern of a polygon containing oblique lines as a polygon in which oblique lines are expressed by a stepwise pattern of a plurality of rectangles, and in which a width R of rectangles which express a oblique line is in the range of Rw<R<Rp·m (where m is the magnification of the exposure apparatus, Rp is the resolution of the exposure apparatus and Rw is the resolution of the mask drawing apparatus), it is possible to manufacture a semiconductor integrated circuit with high reliability at a low cost.

BRIEF DESCRIPTION OF THE DRAWINGS

FIG. 3A to FIG. 3G explain a third embodiment of the present invention.

FIG. 4A to FIG. 4G explain a fourth embodiment of the present invention.

FIG. 5A to FIG. 5G explain a fifth embodiment of the present invention.

FIG. 6A to FIG. 6G explain a sixth embodiment of the present invention.

FIG. 14A to FIG. 14C explain an exposure method of an electron beam exposure apparatus.

FIG. 16A to FIG. 16B explain a projection exposure apparatus.

DETAILED DESCRIPTION OF THE PREFERRED EMBODIMENTS

The preferred embodiments of the present invention will be explained below.

Embodiment 1

Figure 1:
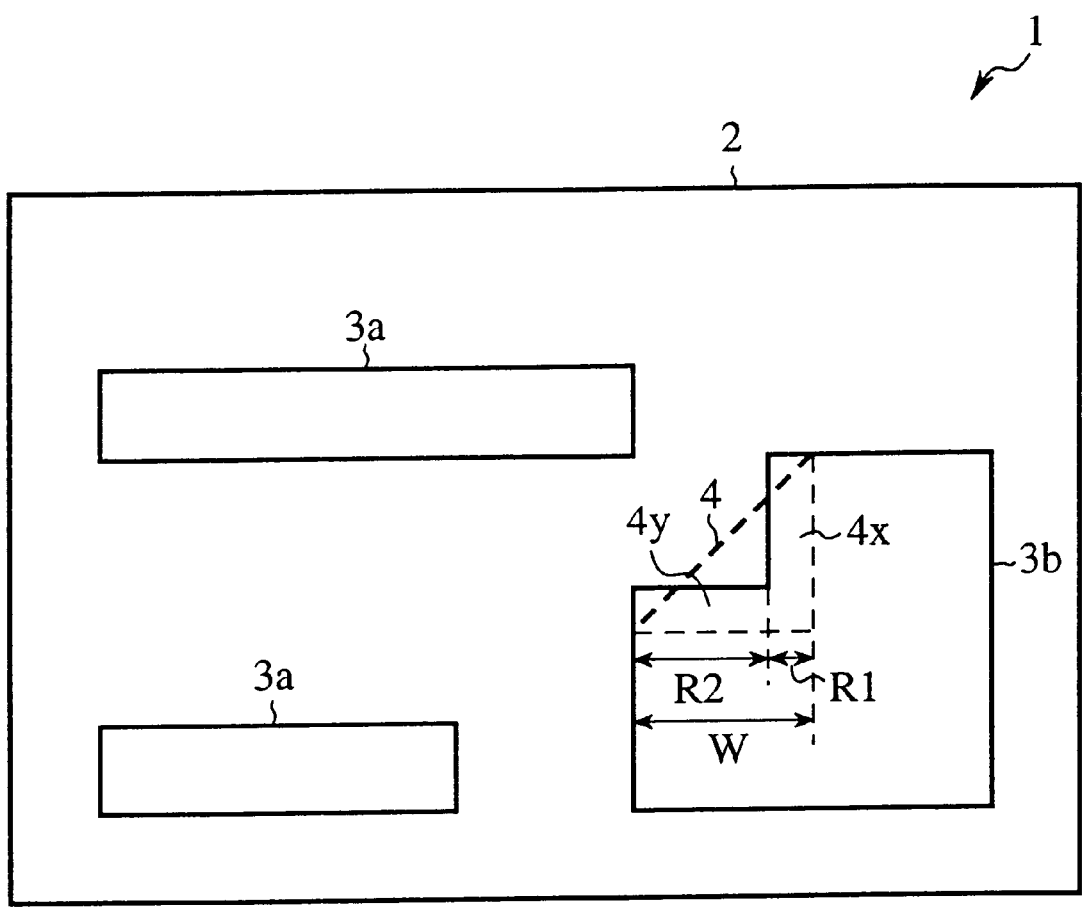
FIG. 1 shows a photomask according to a first embodiment of the present invention.

FIG. 1 shows a photomask according to a first embodiment of the present invention. In FIG. 1, reference numeral 1 denotes a photomask, 2 is a transparent substrate, 3a is a shading pattern which is formed on a principal plane of the transparent base 2 by exposure by an electron beam exposure apparatus of a variable shape beam vector scan type (mask drawing apparatus) based on layout data for a square circuit pattern which does not contain oblique lines, 3b is a shading pattern which is formed on a principal plane of the transparent base 2 by exposure by an electronic beam exposure apparatus of a variable shape beam vector scan type (mask drawing apparatus) based on layout data for a polygon circuit pattern which contains oblique lines. 4 is a line which corresponds to a oblique line in a circuit pattern of a polygon containing a oblique line.

The shading pattern 3b is formed on the principal plane of the transparent base 2 based on layout data for a polygon circuit pattern which contains oblique lines and which has been converted to data for a polygon in which oblique lines are represented in stepwise manner by a number Np of rectangles which are defined by Np=int(W/Rp/m)+1 wherein W is a width of a oblique line, Rp is a resolution of a projection exposure apparatus (exposure apparatus) which mounts a photomask 1, and m is a transcribing power of a projection exposure apparatus.

Generally since Rp·m is more than 10 times larger than the resolution Rw of the electron beam exposure apparatus, Np is smaller than Nw. As a result, the width R of the rectangles is greater than the resolution Rw of the electron beam exposure apparatus. Furthermore from the equation Np=int(W/Rp/m)+1, it is clear that the width R of the rectangles is smaller than Rp·m. That is to say, the width R of the rectangles is in the range Rw<R<Rp·m.

In other words, the shading pattern 3b shows the circuit pattern of a polygon containing a oblique line as a polygon in which a oblique line is displayed in a stepwise manner by a plurality of rectangles when the width R of the rectangle is in the range Rw <R<Rp·m.

As an example in FIG. 1, a oblique line in the circuit pattern of a polygon containing oblique lines is displayed in a step pattern as a rectangle 4x, the width R1 of which is in the range Rw<R1<Rp·m and a rectangle the 4y, the width R2 of which is in the range Rw<R2<Rp·m.

As shown above, according to a first embodiment of the invention, a shading pattern 3b is converted to polygon data in which oblique lines are expressed in stepwise fashion by a number Np(<Nm) of rectangles and then formed based on layout data of a circuit pattern of a polygon containing a oblique line. Thus in comparison with conventional examples, a circuit pattern can be drawn in a short time and with few light exposures. As a result, the throughput of the electron beam exposure apparatus is improved and photomasks can be obtained at a low cost. Furthermore the influence of drift on the electron beam exposure apparatus is reduced, dimensional errors in the photomask are reduced and thus accuracy is improved.

Embodiment 2

Figure 2:
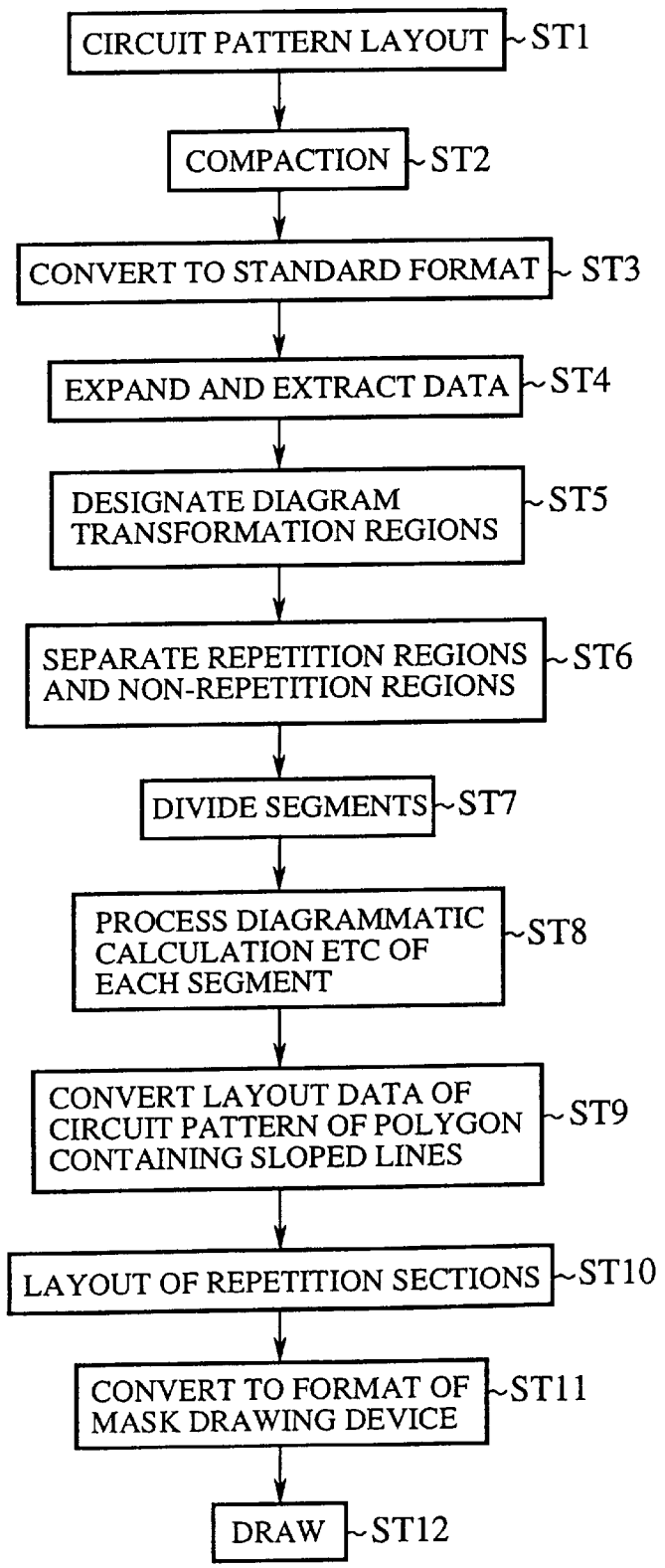
FIG. 2 is a flowchart showing a method of manufacturing a photomask.

The second embodiment of the invention relates to a method of manufacturing the photomask explained in the first embodiment. FIG. 2 is a flowchart of a method of manufacturing the photomask. When a photomask is manufactured, firstly a layout of necessary circuit patterns is performed on the apparatus to be manufactured using a CAD tool. (step ST1)

Thereafter compaction processes are performed on the circuit pattern in order to improve the integration of the circuit pattern and layout data for the circuit pattern are produced (step ST2). At this time, suitably oblique wiring which conforms to design rules is used so as to achieve greater integration between a number of circuit patterns in a small region than is possible with only wiring running in a crosswise directions.

Thereafter, layout data for circuit patterns are converted to standard format (step ST3).

Then data for each layer is extracted from the layout data of the circuit pattern (step ST4).

Then a region is designated which performs the figure conversion in the layout data of the circuit pattern (step ST5).

Then repeated and non-repeated sections are temporarily separated in the layout data of the circuit pattern (step ST6).

Then repeated and non-repeated sections are divided into small segments (step ST7). However the division of repeated sections is performed when the repeated section is larger than the segment.

Then processes such as calculation of existing figures in order to eliminate redundancy are performed on each segment (step ST8).

Then layout data of circuit patterns for polygons containing oblique lines are converted to data for polygons in which oblique lines are represented in stepwise fashion by a plurality of rectangles, in which the overall shape is formed from a plurality of rectangles and in which the width B of rectangles expressing oblique lines is in the range Rw<R<Rp·m (step ST9). In other words, layout data for circuit patterns of polygons containing oblique lines are converted to polygon data which is expressed in stepwise fashion by a number Np of rectangles defined by Np=int(W/Rp/m)+1 wherein W is a width which is the width of the oblique lines, Rp is a resolution of a projection exposure apparatus and m is a magnification of a projection exposure apparatus.

Thereafter repeat regions are allocated to non repeat regions (step ST10).

Then layout data for a circuit pattern is converted to a photomask of a variably shaped beam vector scan type electron beam exposure apparatus (step ST11).

Then a circuit pattern is drawn by a variably shaped beam vector scan type electron beam exposure apparatus based on layout data of a circuit pattern which contains layout data after conversion of the circuit pattern of a polygon containing oblique lines (step ST12). In other words, since the overall layout data after conversion of the circuit pattern of a polygon containing oblique lines is formed by a plurality of rectangles, the circuit pattern is drawn by respective exposure of such rectangles by a variably shaped beam vector scan type electron beam exposure apparatus.

As shown above, according to a second embodiment of the invention, layout data of circuit patterns for polygons containing oblique lines is converted to data for polygons in which oblique line are represented in a stepwise manner by a number Np of rectangles defined by Np=int(W/Rp/m)+1 wherein W is a width which is the width of the oblique lines, Rp is a resolution of a projection exposure apparatus and m is a magnification ratio of a projection exposure apparatus. Thus the number of light exposures is reduced and the required time to draw a circuit pattern is reduced in comparison with the conventional examples. As a result, the throughput of the electron beam exposure apparatus is improved and it is possible to manufacture a low cost photomask. Furthermore the influence of drift on the electron beam exposure apparatus is reduced, dimensional errors in the photomask are reduced and as a result manufacturing accuracy is improved.

Embodiment 3

Embodiments 3 to 6 will be explained based on an example of a shading pattern formed by layout data of a circuit pattern for polygons containing oblique lines.

FIGS. 3A to 3G represent a third embodiment of the invention. FIG. 3A shows a circuit pattern 5 for a polygon containing a oblique line. FIGS. 3B to 3G are shading patterns 3b which display circuit patterns 5 for polygons containing oblique lines shown in FIG. 3A, that is to say, shading patterns 3b formed based on layout data after conversion to circuit patterns 5 of polygons containing oblique lines shown in FIG. 3A. The circuit patterns 5 are displayed as polygons in which oblique lines are represented in stepwise fashion by a plurality of rectangles. The width R of the rectangles representing the oblique lines is in the range Rw<R<Rp·m.

FIGS. 3B and 3E represent the situation wherein the width W of the oblique lines 6 in the circuit pattern 5 shown in FIG. 3A is smaller than Rp·m. FIGS. 3C, 3D, 3F and 3G represent the situation wherein the width W of the oblique lines 6 in the circuit pattern 5 shown in FIG. 3A is greater than Rp·m.

The edge 7a and the edge 7b which contact with the end of the oblique line in the circuit pattern shown in FIG. 3A are in a mutually parallel relationship. The surface area of the shading pattern 3b shown in FIGS. 3B to 3G is equal to the surface area of the circuit pattern shown in FIG. 3A. The step pattern which connects the position 4a and the position 4b which correspond to the end of the oblique line in a shading pattern 3b shown in FIG. 3B to FIG. 3G displays point symmetry with respect to the middle point 4c of the line which corresponds to the oblique line. That is to say, the shading pattern 3b shown in FIG. 3B to FIG. 3G is a shading pattern 3b which is formed based on layout data of a circuit pattern 5 where the edge 7a and the edge 7b which contact with the end of the oblique line in the circuit pattern shown in FIG. 3A are in a mutually parallel relationship. Data formation is based on layout data after conversion of a oblique line to a step pattern which has point symmetry about a middle point 4c on the line which corresponds to a oblique line while holding the surface area after conversion constant. The formula converts layout data of a circuit pattern in which two edges, which contact with an end of the above mentioned oblique line, are in a mutually parallel relationship to a step pattern in which a oblique line has point symmetry about a middle point on the line which corresponds to a oblique line while holding the surface area after conversion constant. The symmetry of the converted section is conserved during the conversion.

Furthermore the edges 8a, 8b which contact with the positions 4a, 4b which correspond to the ends of the oblique line in the shading pattern 3b shown in FIG. 3B to FIG. 3D are in a parallel relationship with the edges 7a, 7b which contact with the end of the oblique line in the circuit pattern 5 shown in FIG. 3A. The edges 8a, 8b which contact with the positions 4a, 4b which correspond to the ends of the oblique line in the shading pattern 3b shown in FIG. 3E to FIG. 3G are in an orthogonal relationship with the edges 7a, 7b which contact with the end of the oblique line 6 in the circuit pattern 5 shown in FIG. 3A. The edges 8a, 8b form an acute angle with the line 4 which corresponds to the oblique line. Since the number of oblique sections in the step pattern of FIGS. 3B, 3C, 3D is lower than that of FIGS. 3E, 3F and 3G, the present embodiment provides the advantage that the amount of data after conversion is lower.

Embodiment 4

FIGS. 4A to 4G show a fourth embodiment of the present invention. FIG. 4A is a circuit pattern 5 of a polygon containing a oblique line. FIGS. 4B to 4G show shading patterns 3b which display circuit patterns 5 for polygons containing oblique lines shown in FIG. 4A, that is to say, shading patterns 3b formed based on layout data after conversion of circuit patterns 5 of polygons containing oblique lines shown in FIG. 4A as polygons in which oblique lines are represented in stepwise fashion by a plurality of rectangles. The width R of the rectangles representing the oblique lines is in the range Rw<R<Rp·m.

FIGS. 4B and 4E represent the situation wherein the width W of the oblique lines 6 in the circuit pattern 5 shown in FIG. 4A is smaller than Rp·m. FIGS. 4C, 4D, 4F and 4G represent the situation wherein the width W of the oblique lines 6 in the circuit pattern 5 shown in FIG. 4A is greater than Rp·m.

The edge 7a and the edge 7b which contact with the end of the oblique line in the circuit pattern 5 shown in FIG. 4A are in a mutually parallel relationship. The surface area of the shading pattern 3b shown in FIGS. 4B to 4G is equal to the surface area of the circuit pattern 5 shown in FIG. 4A. The step pattern which connects the position 4a and the position 4b which correspond to the end of the oblique line in a shading pattern 3b shown in FIG. 4B to FIG. 4G displays mirror symmetry with respect to the vertical bisector 4d of the line which corresponds to the oblique line. That is to say, the shading pattern 3b shown in FIG. 4B to FIG. 4G is a shading pattern 3b which forms layout data of a circuit pattern 5 where the edge 7a and the edge 7b which contact with the end of the oblique line in the circuit pattern shown in FIG. 3A are in a mutually parallel relationship. Data formation is based on layout data after conversion of a oblique line to a step pattern which has mirror symmetry about a vertical bisector 4d on the line which corresponds to a oblique line while holding the surface area after conversion constant.

Furthermore the edge 8a which contacts with the position 4a which corresponds to the ends of the oblique line in the shading pattern 3b shown in FIG. 4B to FIG. 4D is in a parallel relationship with the edges 7a, 7b which contact with the end of the oblique line in the circuit pattern 5 shown in FIG. 4A. The edge 8b which contacts with the position 4b which corresponds to the end of the oblique line in the shading pattern 3b shown in FIG. 4B to FIG. 4D are in a orthogonal relationship with the edges 7a, 7b which contact with the end of the oblique line in the circuit pattern 5 shown in FIG. 4A. The edge 8a which contacts with the position 4a which corresponds to the end of the oblique line in the shading pattern 3b shown in FIG. 4E to FIG. 4G is in an orthogonal relationship with the edges 7a, 7b which contact with the end of the oblique line 6 in the circuit pattern 5 shown in FIG. 4A. The edge 8b which contacts with the position 4b which corresponds to the end of the oblique line in the shading pattern 3b shown in FIG. 4E to FIG. 4G is in a parallel relationship with the edges 7a, 7b which contact with the end of the oblique line 6 in the circuit pattern 5 shown in FIG. 4A. The edges 8a, 8b form an acute angle with the line 4 which corresponds with the oblique line.

Embodiment 5

A fifth embodiment of the present invention will be explained with reference to FIGS. 5A to 5G. FIG. 5A shows a circuit pattern 5 of a polygon containing a oblique line. FIG. 5B to FIG. 5G show shading patterns 3b which display circuit patterns 5 for polygons containing oblique lines shown in FIG. 5A, that is to say, shading patterns 3b formed based on layout data after conversion of circuit patterns 5 of polygons containing oblique lines shown in FIG. 5A. The circuit patterns are displayed as polygons in which oblique lines are represented in stepwise fashion by a plurality of rectangles. The width R of the rectangles representing the oblique lines is in the range Rw<R<Rp·m.

FIGS. 5B and 5E represent the situation wherein the width W of the oblique lines 6 in the circuit pattern 5 shown in FIG. 5A is smaller than Rp·m. FIGS. 5C, 5D, 5F and 5G represent the situation wherein the width W of the oblique lines 6 in the circuit pattern 5 shown in FIG. 5A is greater than Rp·m.

The edge 7a and the edge 7b which contact with the end of the oblique line in the circuit pattern 5 shown in FIG. 5A are in a mutually parallel relationship. The surface area of the shading pattern 3b shown in FIGS. 5B to 5G is equal to the surface area of the circuit pattern shown in FIG. 5A. The step pattern which connects the position 4a and the position 4b which correspond to the end of the oblique line in a shading pattern 3b shown in FIG. 5B to FIG. 5G displays point symmetry with respect to the middle point 4c of the line which corresponds to the oblique line. That is to say, the shading pattern 3b shown in FIG. 5B to FIG. 5G is a shading pattern 3b which forms layout data of a circuit pattern 5 where the edge 7a and the edge 7b which contact with the end of the oblique line in the circuit pattern shown in FIG. 5A are in a mutually orthogonal relationship. Data formation is based on layout data after conversion of a oblique line to a step pattern which has point symmetry about a middle point 4c on the line which corresponds to a oblique line while holding the surface area after conversion constant.

Furthermore the edge 8a which contacts with the position 4a which corresponds to the end of the oblique line in the shading pattern 3b shown in FIG. 5B to FIG. 5D is in a parallel relationship with the edge 7a which contacts with the end of the oblique line in the circuit pattern 5 shown in FIG. 5A. The edge 8b which contacts with the position 4b which corresponds to the end of the oblique line in the shading pattern 3b shown in FIG. 5B to FIG. 5D is in an orthogonal relationship with the edge 7b which contacts with the end of the oblique line in the circuit pattern 5 shown in FIG. 5A. The edge 8a which contacts with the position 4a which corresponds to the ends of the oblique line in the shading pattern 3b shown in FIG. 5E to FIG. 5G is in an orthogonal relationship with the edge 7a which contacts with the end of the oblique line 6 in the circuit pattern 5 shown in FIG. 5A. The edge 8b which contacts with the position 4b which corresponds to the end of the oblique line in the shading pattern 3b shown in FIG. 5E to FIG. 5G is in a parallel relationship with the edge 7b which contacts with the end of the oblique line 6 in the circuit pattern 5 shown in FIG. 6A. The edges 8a, 8b form an acute angle with the line 4 which corresponds with the oblique line.

Embodiment 6

A sixth embodiment of the present invention will be explained with reference to FIGS. 6A to 6G. FIG. 6A shows a circuit pattern 5 of a polygon containing a oblique line. FIG. 6B to FIG. 6G are shading patterns 3b which display circuit patterns 5 for polygons containing oblique lines shown in FIG. 6A, that is to say, shading patterns 3b formed based on layout data after conversion of circuit patterns 5 of polygons containing oblique lines shown in FIG. 6A. Such patterns are displayed as Polygons in which oblique lines are represented in stepwise fashion by a plurality of rectangles. The width R of the rectangles representing the oblique lines is in the range Rw<R<Rp·m.

FIGS. 6B and 6E represent the situation wherein the width W of the oblique lines 6 in the circuit pattern 5 shown in FIG. 6A is smaller than Rp·m. FIGS. 6C, 6D, 6F and 6G represent the situation wherein the width W of the oblique lines 6 in the circuit pattern 5 shown in FIG. 6A is greater than Rp·m.

The edge 7a and the edge 7b which contact with the end of the oblique line in the circuit pattern 5 shown in FIG. 6A are in a mutually orthogonal relationship. The surface area of the shading pattern 3b shown in FIGS. 6B to 6G is equal to the surface area of the circuit pattern shown in FIG. 6A. The step pattern which connects the position 4a and the position 4b which correspond to the end of the oblique line in a shading pattern 3b shown in FIG. 6B to FIG. 6G displays mirror symmetry with respect to the vertical bisector 4d of the line which corresponds to the oblique line. That is to say, the shading pattern 3b shown in FIG. 6B to FIG. 6G is a shading pattern 3b which forms layout data of a circuit pattern 5 where the edge 7a and the edge 7b which contact with the end of the oblique line in the circuit pattern shown in FIG. 6A are in a mutually orthogonal relationship. Data formation is based on layout data after conversion of a oblique line to a step pattern which has mirror symmetry about a vertical bisector 4d on the line which corresponds to a oblique line while holding the surface area after conversion constant. The formula converts layout data of a circuit pattern in which two edges, which contact with an end of the above mentioned oblique line, are in a mutually orthogonal relationship to a step pattern in which a oblique line has mirror symmetry about a vertical bisector on the line which corresponds to a oblique line, while holding the surface area after conversion constant. Thus the symmetry of the converted section is conserved.

Furthermore the edge 8a which contacts with the position 4a which corresponds to the end of the oblique line in the shading pattern 3b shown in FIG. 6B to FIG. 6D is in a parallel relationship with the edge 7a which contacts with the end of the oblique line in the circuit pattern 5 shown in FIG. 6A. The edge 8b which contacts with the position 4b which corresponds to the end of the oblique line in the shading pattern 3b shown in FIG. 6B to FIG. 6D is in a parallel relationship with the edge 7b which contacts with the end of the oblique line in the circuit pattern 5 shown in FIG. 6A. The edge 8a which contacts with the position 4a which corresponds to the end of the oblique line in the shading pattern 3b shown in FIG. 6E to FIG. 6G is in an orthogonal relationship with the edge 7a which contacts with the end of the oblique line 6 in the circuit pattern 5 shown in FIG. 6A. The edge 8b which contacts with the position 4b which corresponds to the end of the oblique line in the shading pattern 3b shown in FIG. 6E to FIG. 6G is in an orthogonal relationship with the edge 7b which contacts with the end of the oblique line 6 in the circuit pattern 5 shown in FIG. 6A. The edges 8a, 8b form an acute angle with the line 4 which corresponds with the oblique line. Since the number of oblique sections in the step pattern of FIGS. 6B, 6C, 6D is lower than that of FIGS. 6E, 6F and 6G, the present embodiment provides the advantage that the amount of data after conversion is lower.

Embodiment 7

Embodiments 7 to 10 of the present invention will be explained based on an example of layout data after conversion of a circuit pattern containing a oblique line.

A seventh embodiment of the present invention will be explained with reference to FIGS. 7A to 7H. FIG. 7A to FIG. 7H show layout data after conversion of a circuit pattern 5 of a polygon containing a oblique line shown in FIG. 3A. The layout data after conversion of a circuit pattern of a polygon containing a oblique line shown in FIG. 3A is polygon data, the entirety of which formed from a plurality of rectangles and which is represented in a stepwise pattern by a plurality of rectangles. The width R of the rectangles representing the oblique lines is in the range Rw<R<Rp·m. However FIG. 7A to FIG. 7H show only the appearance of the entirety formed from the plurality of rectangles.

Figure 7A:
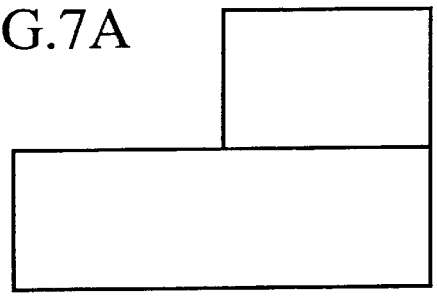
FIG. 7A to FIG. 7H explain a seventh embodiment of the present invention.
Figure 7E:
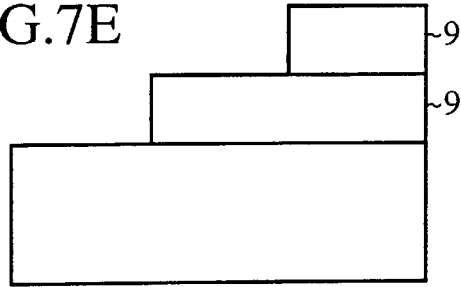
Figure 7B:
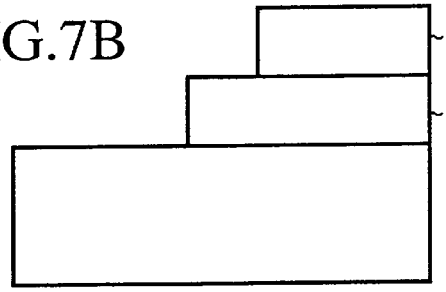
Figure 7F:
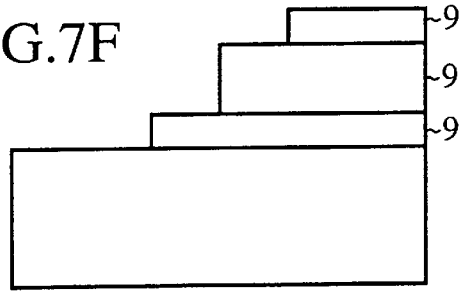

The layout data shown in FIG. 7A form the basis of formation of the shading pattern 3b shown in FIG. 3B. The layout data shown in FIG. 7B form the basis of formation of the shading pattern 3b shown in FIG. 3c. The layout data shown in FIG. 7C and FIG. 7D form the basis of formation of the shading pattern 3b shown in FIG. 3D. The layout data shown in FIG. 7E form the basis of formation of the shading pattern 3b shown in FIG. 3E. The layout data shown in FIG. 7G and FIG. 7H form the basis of formation of the shading pattern 3b shown in FIG. 3G.

Generally the drawing accuracy of minute rectangles is poor on comparison with that of large rectangles. Furthermore when a minute rectangle is placed on the outside of a polygon, the drawing accuracy of an entire shape containing minute rectangles is reduced. As the number of rectangles decreases, the amount of data after conversion also decreases.

Figure 7C:
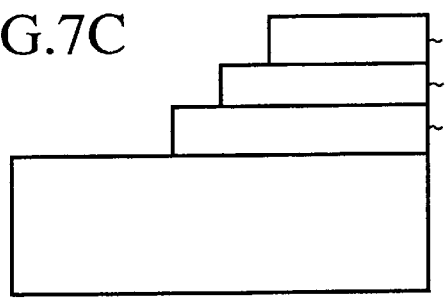
Figure 7G:
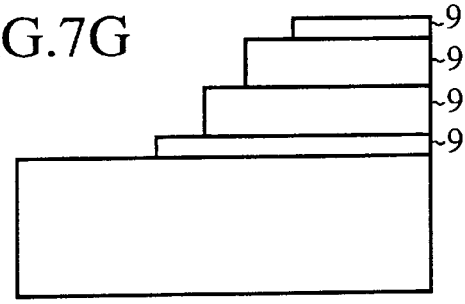
Figure 7D:
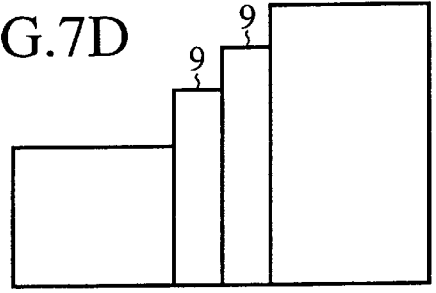
Figure 7H:
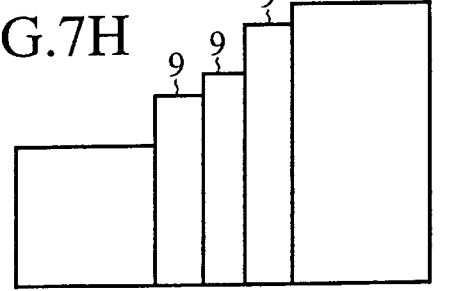

When the layout data shown in FIG. 7C is compared with the layout data in FIG. 7D, the number of rectangles comprising layout data shown in FIG. 7C is the same as the number of rectangles comprising layout data shown in FIG. 7D. However the number of minute rectangles 9 in the layout data shown in FIG. 7C is higher than the number of minute rectangles 9 in the layout data shown in FIG. 7D. Furthermore the minute rectangles 9 comprising layout data shown in FIG. 7C are placed on the outside. Therefore when a shading pattern is formed based on layout data shown in FIG. 7D, it is possible to form a shading pattern of higher accuracy in comparison with the shading pattern based on the layout data shown in FIG. 7C. In the same way, when a shading pattern is formed based on layout data shown in FIG. 7H, it is possible to form a shading pattern of higher accuracy in comparison with the shading pattern based on the layout data shown in FIG. 7G. In particular, the minute figure in the layout data shown in FIG. 7G is smaller than the minute rectangle in the layout data shown in FIG. 7C and furthermore is placed on the outside. Thus the advantage is conspicuous on comparing FIGS. 7G and 7H.

Embodiment 8

An eighth embodiment of the present invention will be explained with reference to FIGS. 8A to 8H. FIG. 8A to FIG. 8H show layout data after conversion of a circuit pattern 5 of a polygon containing a oblique line shown in FIG. 4A. The layout data after conversion of a circuit pattern 5 of a polygon containing a oblique line shown in FIG. 4A is polygon data the entirety of which formed from a plurality of rectangles and which is represented in a stepwise pattern by a plurality of rectangles. The width of the rectangles representing the oblique lines is in the range Rw<R<Rp·m. However FIG. 8A to FIG. 8H show only the appearance of the entirety formed from the plurality of rectangles.

Figure 8A:
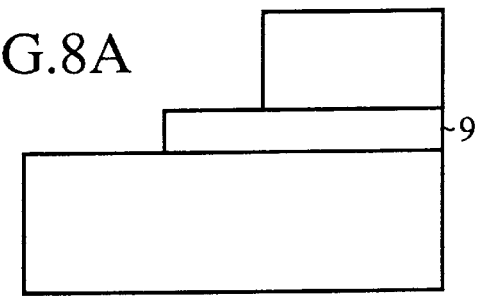
FIG. 8A to FIG. 8H explain an eighth embodiment of the present invention.
Figure 8E:
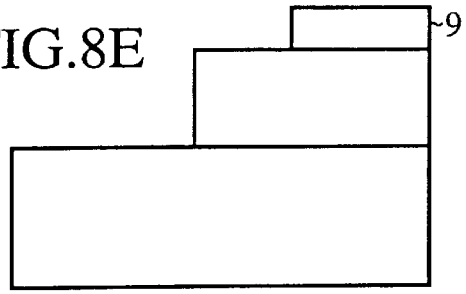
Figure 8B:
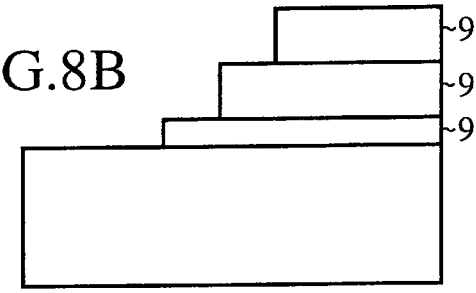
Figure 8F:
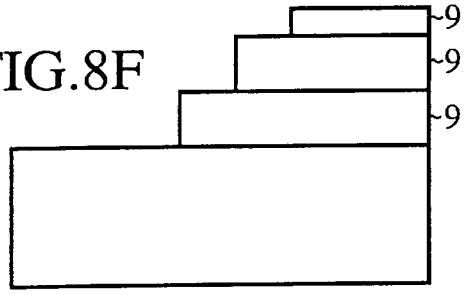

The layout data shown in FIG. 8A form the basis of formation of the shading pattern 3b shown in FIG. 4B. The layout data shown in FIG. 8B form the basis of formation of the shading pattern 3b shown in FIG. 4C. The layout data shown in FIG. 8C and FIG. 8D form the basis of formation of the shading pattern 3b shown in FIG. 4D. The layout data shown in FIG. 8E form the basis of formation of the shading pattern 3b shown in FIG. 4E. The layout data shown in FIG. 8F form the basis of formation of the shading pattern 3b shown in FIG. 4F. The layout data shown in FIGS. 8G and 8H form the basis of formation of the shading pattern 3b shown in FIG. 4G.

Figure 8C:
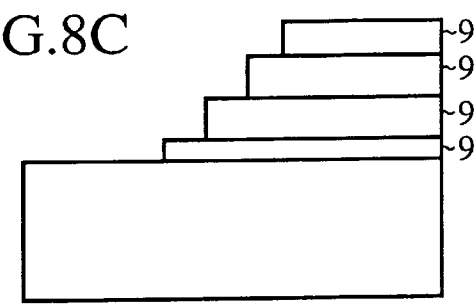
Figure 8G:
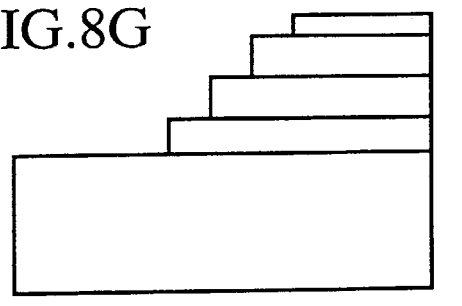
Figure 8D:
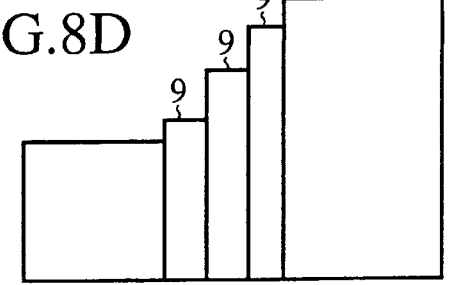
Figure 8H:
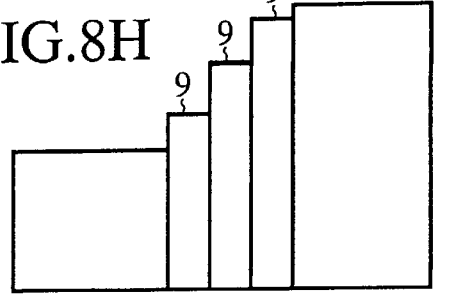

When the layout data shown in FIG. 8C is compared with the layout data in FIG. 8D, the number of rectangles comprising layout data shown in FIG. 8C is the same as the number of rectangles comprising layout data shown in FIG. 8D. However the number of minute rectangles 9 in the layout data shown in FIG. 8C is higher than the number of minute rectangles 9 in the layout data shown in FIG. 8D. Furthermore the minute rectangles 9 comprising layout data shown in FIG. 8C are placed on the outside. Therefore when a shading pattern is formed based on layout data shown in FIG. 8D, it is possible to form a shading pattern of higher accuracy in comparison with the shading pattern based on the layout data shown in FIG. 8C. In the same way, when a shading pattern is formed based on layout data shown in FIG. 8H, it is possible to form a shading pattern of higher accuracy in comparison with the shading pattern based on the layout data shown in FIG. 8G. In particular, the minute figure in the layout data shown in FIG. 8G is smaller than the minute rectangle 9 in the layout data shown in FIG. 8C and furthermore is placed on the outside. Thus the advantage is conspicuous on comparing FIGS. 8G and 8H.

Embodiment 9

An ninth embodiment of the present invention will be explained with reference to FIGS. 9A to 9H. FIG. 9A to FIG. 9H show layout data after conversion of a circuit pattern 5 of a polygon containing a oblique line shown in FIG. 5A. The layout data after conversion of a circuit pattern 5 of a polygon containing a oblique line shown in FIG. 5A is polygon data, the entirety of which formed from a plurality of rectangles and which is represented in a stepwise pattern by a plurality of rectangles. The width R of the rectangles representing the oblique lines is in the range Rw<R<Rp·m. However FIG. 9A to FIG. 9H show only the appearance of the entirety formed from the plurality of rectangles.

Figure 9A:
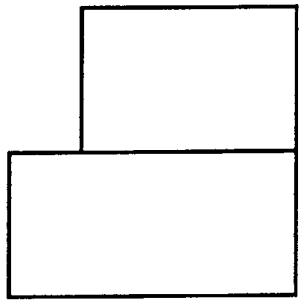
FIG. 9A to FIG. 9H explain a ninth embodiment of the present invention.
Figure 9E:
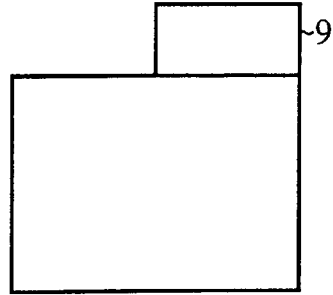
Figure 9B:
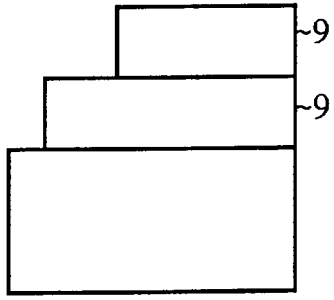
Figure 9F:
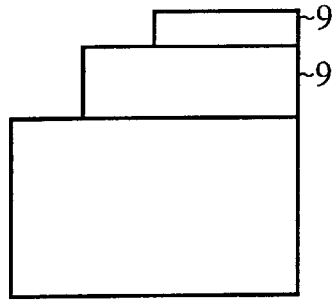

The layout data shown in FIG. 9A form the basis of formation of the shading pattern 3b shown in FIG. 5B. The layout data shown in FIG. 9B form the basis of formation of the shading pattern 3b shown in FIG. 5C. The layout data shown in FIG. 9C and FIG. 9D form the basis of formation of the shading pattern 3b shown in FIG. 5D. The layout data shown in FIG. 9E form the basis of formation of the shading pattern 3b shown in FIG. 5E. The layout data shown in FIG. 9F form the basis of formation of the shading pattern 3b shown in FIG. 5F. The layout data shown in FIG. 9G and 9H form the basis of formation of the shading pattern 3b shown in FIG. 5G.

Figure 9C:
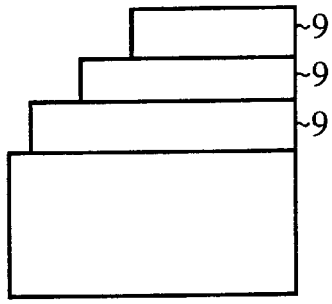
Figure 9G:
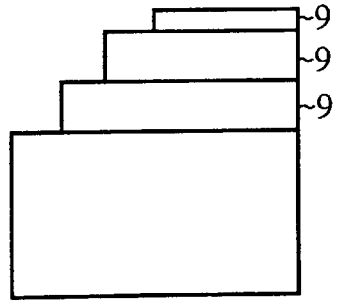
Figure 9D:
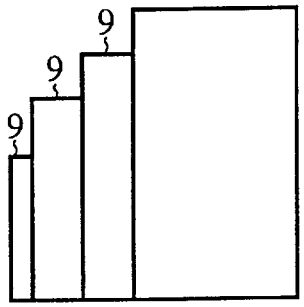
Figure 9H:
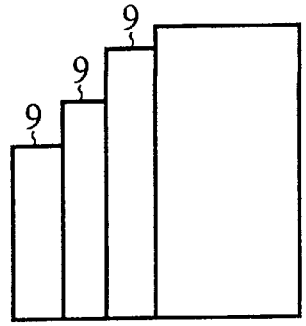

When the layout data shown in FIG. 9C is compared with the layout data FIG. 9D, the number of rectangles comprising layout data shown in FIG. 9C is the same as the number of rectangles comprising layout data shown in FIG. 9D. However although the number of minute rectangles 9 in the layout data shown in FIG. 9C is the same as the number of minute rectangles 9 in the layout data shown in FIG. 9D, more minute rectangles 9 than are in the layout data shown in FIG. 9D are placed on the outside. Therefore when a shading pattern is formed based on layout data shown in FIG. 9C, it is possible to form a shading pattern of higher accuracy in comparison with the shading pattern based on the layout data shown in FIG. 9D. In the same way, when a shading pattern is formed based on layout data shown in FIG. 9H, it is possible to form a shading pattern of higher accuracy in comparison with the shading pattern based on the layout data shown in FIG. 9G.

Embodiment 10

An tenth embodiment of the present invention will be explained with reference to FIGS. 10A to 10H. FIG. 10A to FIG. 10H show layout data after conversion of a circuit pattern 5 of a polygon containing a oblique line shown in FIG. 6A The layout data after conversion of a circuit pattern 5 of a polygon containing a oblique line shown in FIG. 6A is polygon data, the entirety of which formed from a plurality of rectangles and which is represented in a stepwise pattern by a plurality of rectangles. The width R of the rectangles representing the oblique lines is in the range Rw<R<Rp·m. However FIG. 10A to FIG. 10H show only the appearance of the entirety formed from the plurality of rectangles.

Figure 10A:
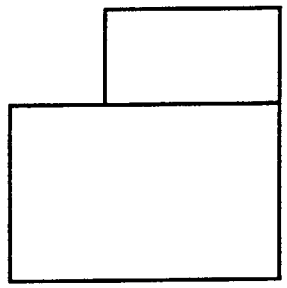
FIG. 10A to FIG. 10H explain a tenth embodiment of the present invention.
Figure 10E:
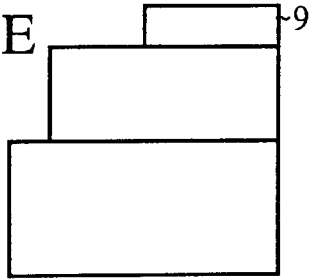
Figure 10B:
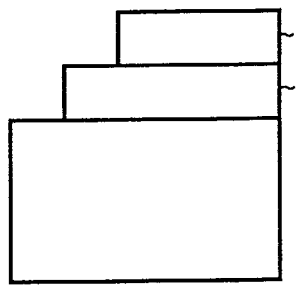
Figure 10F:
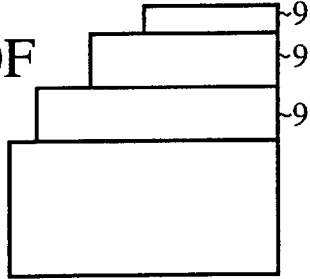
Figure 10C:
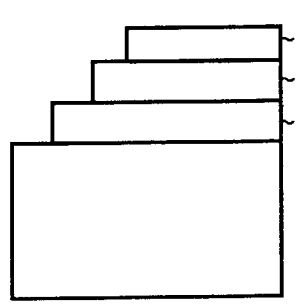

The layout data shown in FIG. 10A form the basis of formation of the shading pattern 3b shown in FIG. 6B. The layout data shown in FIG. 10B form the basis of formation of the shading pattern 3b shown in FIG. 6C. The layout data shown in FIG. 10C and FIG. 10D form the basis of formation of the shading pattern 3b shown in FIG. 6D. The layout data shown in FIG. 10E form the basis of formation of the shading pattern 3b shown in FIG. 6E. The layout data shown in FIG. 10F form the basis of formation of the shading pattern 3b shown in FIG. 6F. The layout data shown in FIGS. 10G and 10H form the basis of formation of the shading pattern 3b shown in FIG. 6G.

Figure 10G:
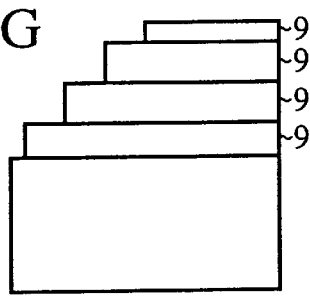
Figure 10D:
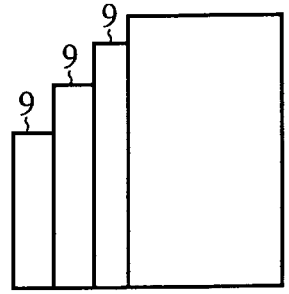
Figure 10H:
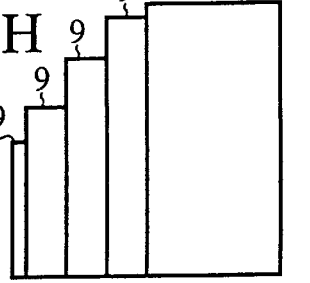

When the layout data shown in FIG. 10G is compared with the layout data in FIG. 10H, the number of rectangles comprising layout data shown in FIG. 10G is the same as the number of rectangles comprising layout data shown in FIG. 10H. However although the number of minute rectangles 9 in the layout data shown in FIG. 10G is the same as the number of minute rectangles 9 in the layout data shown in FIG. 10H, minute rectangles 9 which are more minute than layout data shown in FIG. 10H are placed on the outside. Therefore when a shading pattern is formed based on layout data shown in FIG. 10G, it is possible to form a shading pattern of higher accuracy in comparison with the shading pattern based on the layout data shown in FIG. 10H.

Embodiment 11

Embodiment 11 comprises a method of testing and repairing defects generated in a photomask as explained in embodiment 1.

Figure 11A:
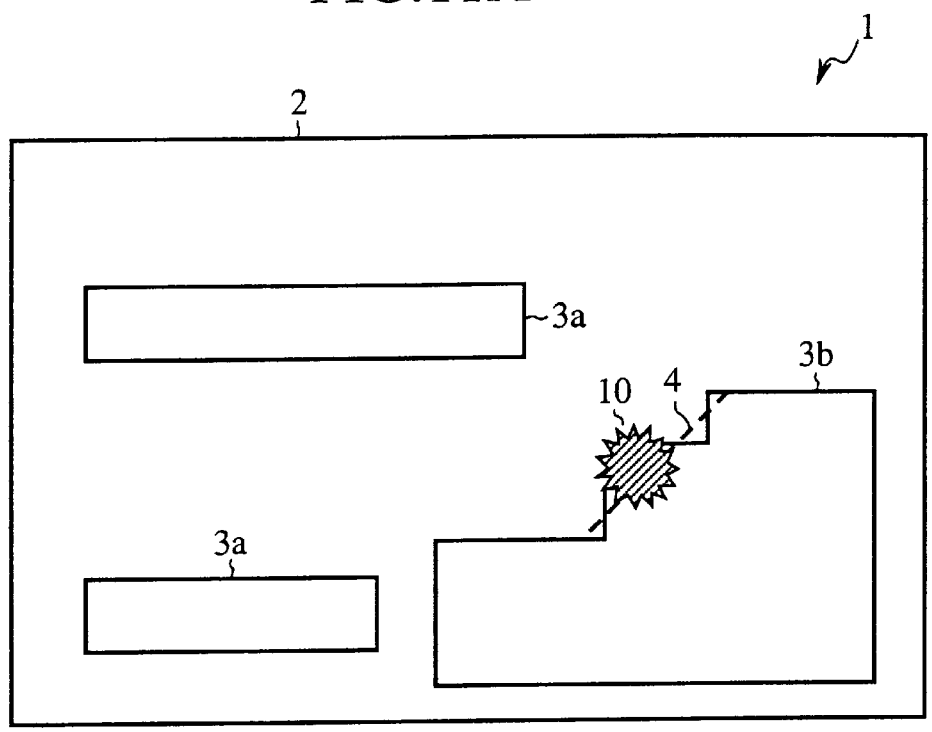
FIG. 11A and FIG. 11B explain a test/repair method of a photomask.
Figure 11B:
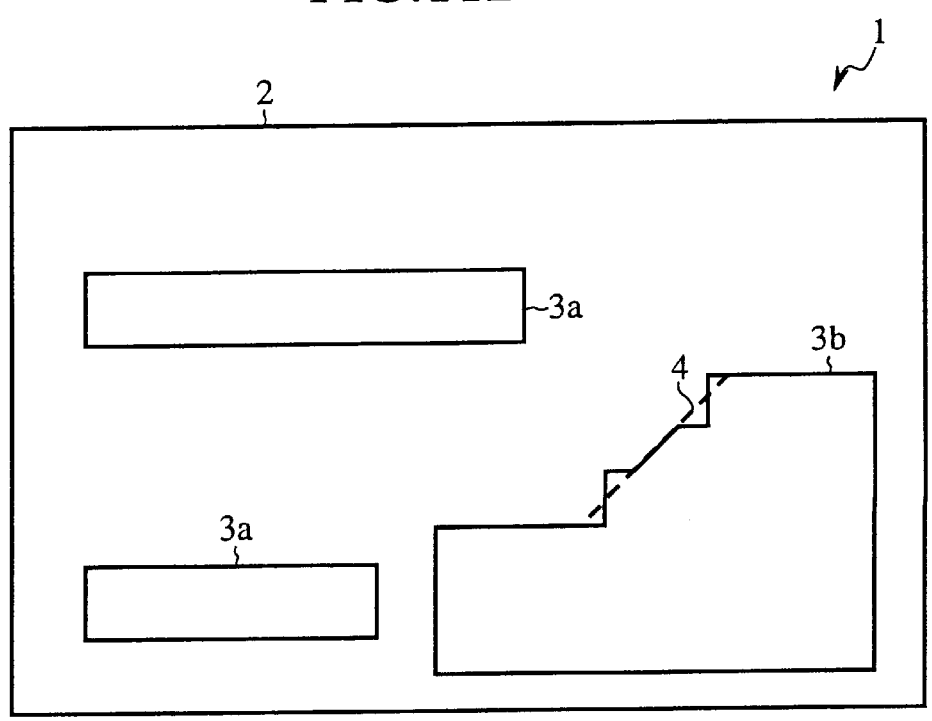

An eleventh embodiment of the present invention will be explained with reference to FIGS. 11A to 11B. FIG. 11A shows the generation of a defect 10 in a position on a line 4 which corresponds to a oblique line of a shading pattern 3b in a photomask 1 as explained in a first embodiment. FIG. 11B shows the appearance after the testing and repairing of the defect.

Normally when a defect is generated in a manufactured photomask, by reference to drawing data, a FIB (Focused Ion Beam) is used to bury the defect if it is a "white". If "black", defects are buried by laser application. Repairing is based on drawing data. As a result, when a defect 10 is generated in a position on a line 4 which corresponds to a curved line of a shading pattern 3b in a photomask 1 as explained in embodiment 1, the defect is normally tested and repaired in a stepwise manner by reference to drawing data.

However the ultimate shape which is intended to be manufactured using a shading pattern 3b in a photomask 1 as explained in a first embodiment is a polygon which contains a curved line, that is to say, the shape of a circuit pattern. As a result, even if a defect 10 which is generated at a position on a line 4 which corresponds to a oblique line of a shading pattern 3b is tested and repaired to a oblique by referring to layout data of a circuit pattern, no problem arises.

As explained above, according to embodiment 11, when a defect 10 generated at a position on a line 4 which corresponds to a oblique line of a shading pattern 3b is tested and repaired to a oblique by referring to layout data of a circuit pattern, the defect is easily tested and repaired as there is no necessity to test and repair the defect in a step shaped.

Embodiment 12

A twelfth embodiment of the invention comprises a method of using a photomask as explained in a first embodiment of the invention.

Figure 12A:
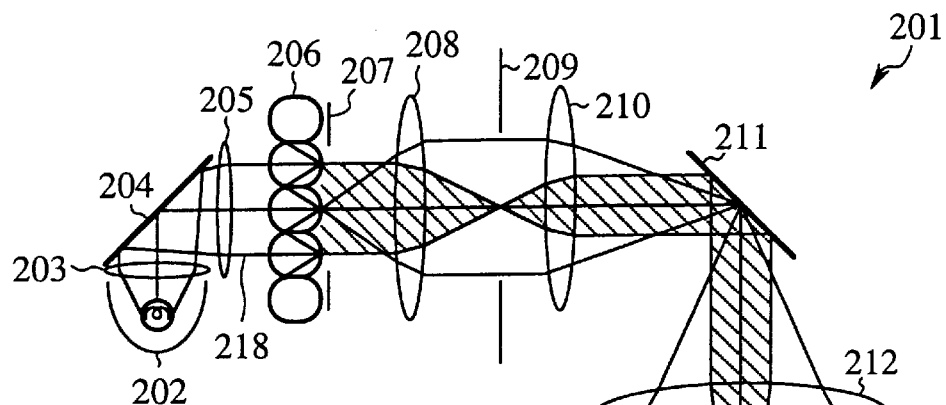
FIG. 12A to FIG. 12C explain a method of use for a photomask.
Figure 12B:
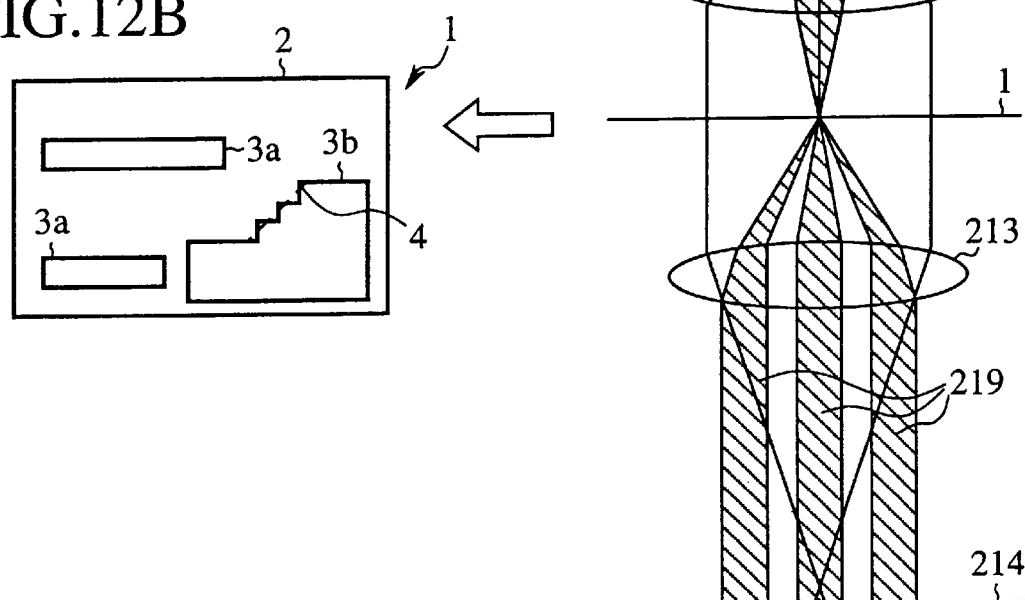
Figure 12C:
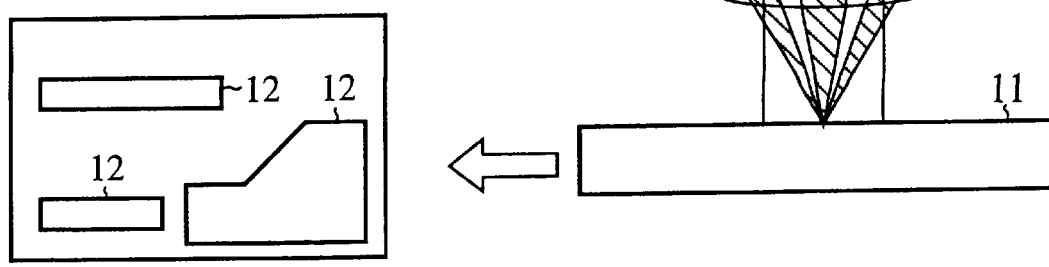
Figure 13:
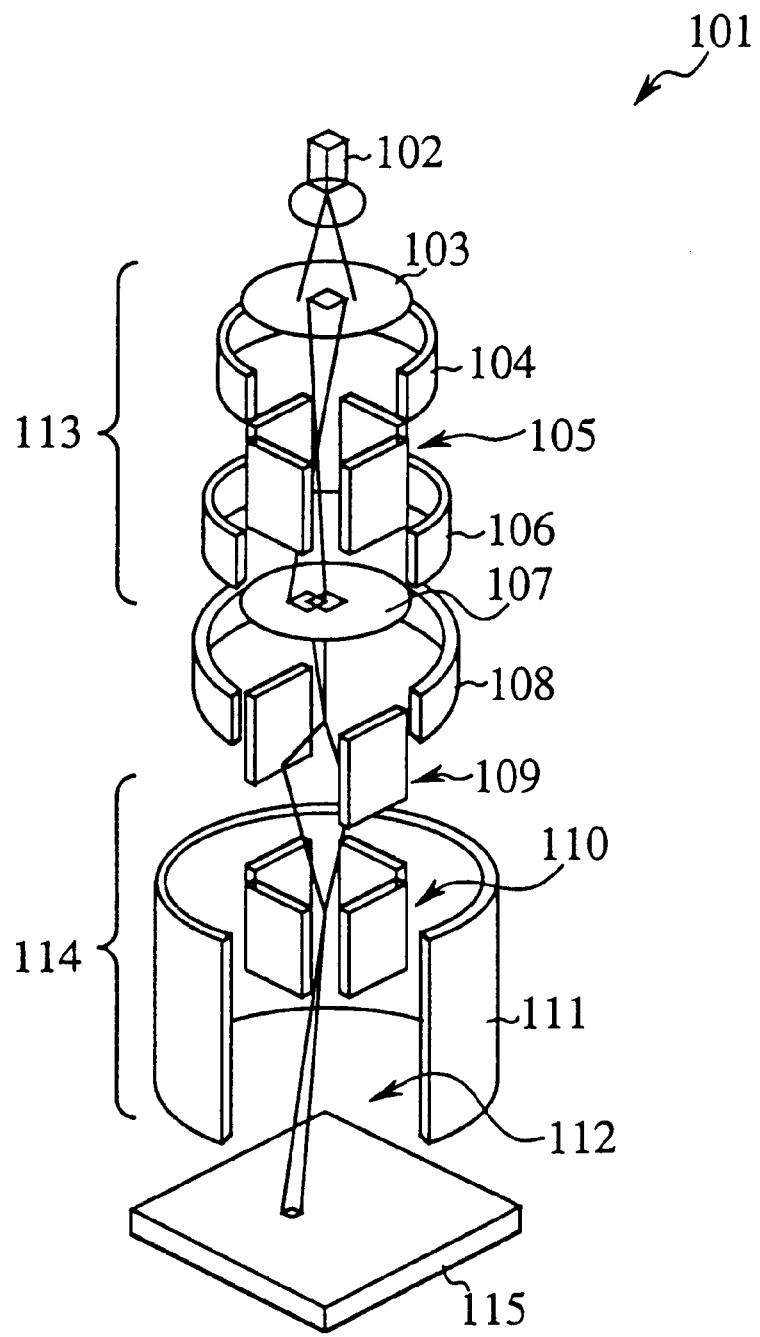
FIG. 13 shows an electron beam exposure apparatus of a variable shape beam vector scan type.
Figure 15:
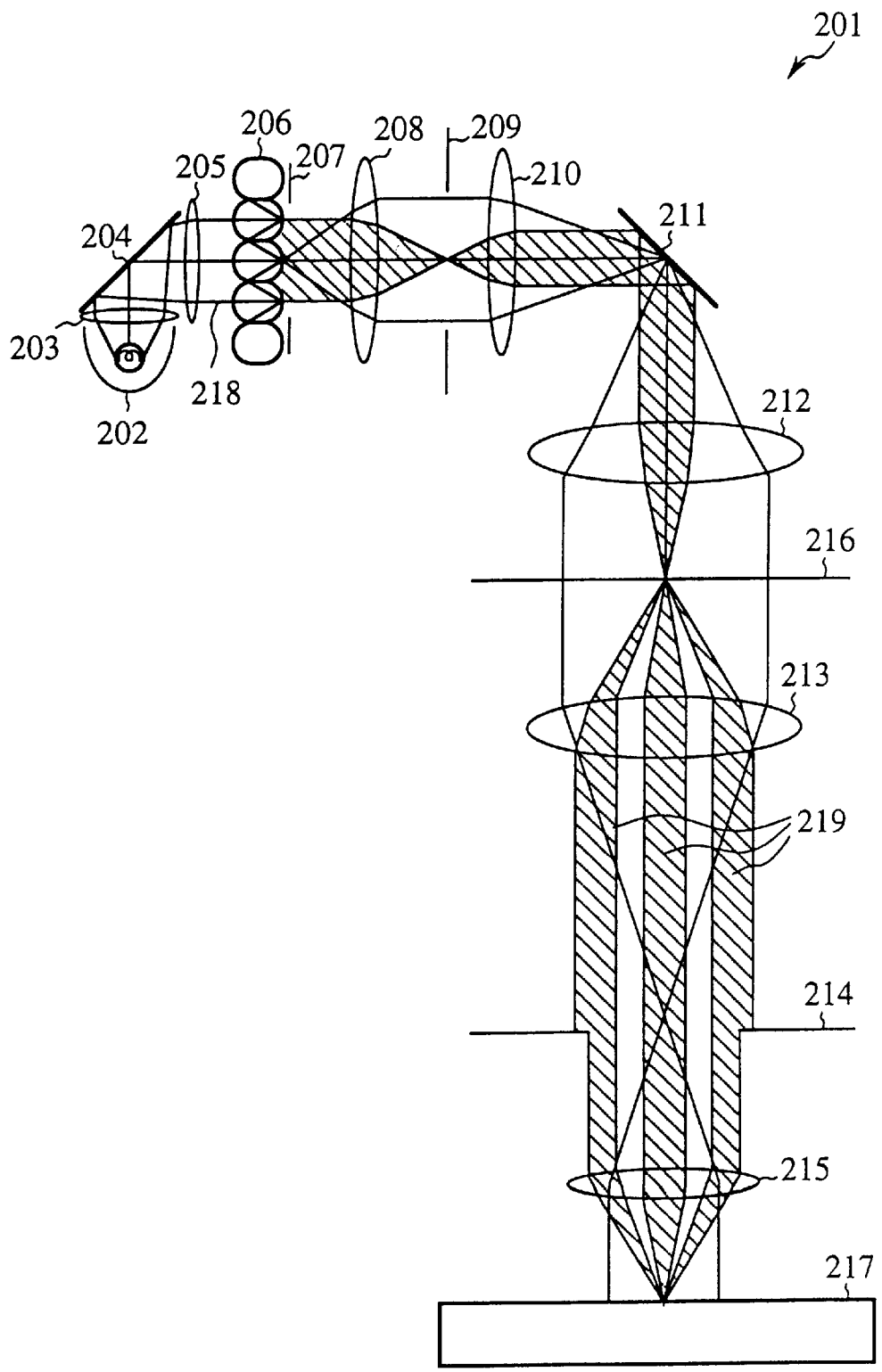
FIG. 15 shows a projection exposure apparatus.

FIG. 12A to FIG. 12C show a method of using the photomask. FIG. 12A shows a projection exposure device 201. FIG. 12B shows a photomask 1 as explained in a first embodiment which is mounted in a projection exposure apparatus 201. FIG. 12C shows a wafer 11 exposed by a projection exposure apparatus 201.

The shading pattern 3b displays a circuit pattern of a polygon which contains a oblique line as a polygon in which a oblique line is expressed in a stepwise manner by a plurality of rectangles. The height of one step of the step pattern, that is to say, the width R of the rectangle which expresses the oblique line is in the range Rw<R<Rp·m. As a result, when a wafer 11 is exposed using a photomask 1 as explained in the first embodiment, it is not possible to accurately project the shape of the shading pattern 3b. A step pattern is projected as the oblique line and a shading pattern 12 which comprises a circuit pattern is formed on the wafer 11.

Thus when manufacturing a liquid crystal display or semiconductor integrated circuit using a photomask 1 as explained in embodiment 1, it is possible to manufacture the liquid crystal display or semiconductor integrated circuit with high reliability at a low cost.

What is claimed is:

1. A photomask comprising:
    a transparent base, and
    a shading pattern which displays a circuit pattern of a polygon containing an oblique line as a polygon in which said oblique line is expressed in a stepwise manner by a plurality of rectangles, wherein
    a width R of said rectangles is in a range Rw<R<Rp·m,
    wherein Rw is a resolution power of a mask drawing device, Rp is a resolving power of a projection exposure apparatus and m is a magnification of a projection exposure apparatus.

2. A photomask according to claim 1, wherein a surface area of the polygon containing the oblique line is equal to a surface area of the polygon in which said oblique line is expressed in the stepwise manner.

3. A photomask according to claim 1, wherein an edge contacting with an end of said oblique line in the polygon containing the oblique line has a parallel relationship with an edge contacting with a position which corresponds to an end of said oblique line in the polygon in which said oblique line is expressed in the stepwise manner.

4. A photomask according to claim 1, wherein an edge contacting with an end of said oblique line in the polygon containing the oblique line has an orthogonal relationship with an edge contacting with a position which corresponds to an end of said oblique line in the polygon in which said oblique line is expressed in the stepwise manner.

5. A photomask according to claim 1, wherein when respective edges, each contacting with one end of said oblique line in the polygon containing the oblique line, are in a mutually parallel relationship, a step pattern which expresses said oblique line displays point symmetry with respect to a middle point of a line corresponding to said oblique line.

6. A photomask according to claim 1, wherein when respective edges, each contacting with on end of said oblique line in the polygon containing the oblique line, are in a mutually parallel relationship, a step pattern which expresses said oblique line displays mirror symmetry with respect to a vertical bisector of a line corresponding to said oblique line.

7. A photomask according to claim 1, wherein when respective edges, each contacting with one end of said oblique line in the polygon containing the oblique line, are in a mutually orthogonal relationship, a step pattern which expresses said oblique line displays point symmetry with respect to a middle point of a line corresponding to said oblique line.

8. A photomask according to claim 1, wherein when respective edges, each contacting with on end of said oblique line in the polygon containing the oblique line, are in a mutually orthogonal relationship, a step pattern which expresses said oblique line displays mirror symmetry with respect to a vertical bisector of a line corresponding to said oblique line.

9. A method of manufacturing a photomask comprising:
    a step of performing a layout of a circuit pattern and producing layout data,
    a step of converting layout data of a circuit pattern of a polygon containing an oblique line to data of a polygon in which an oblique line is expressed in a step pattern by a plurality of rectangles and in which an entirety of said polygon is formed by a plurality of rectangles,
    a step of drawing a circuit pattern based on layout data after conversion of at circuit pattern of the polygon containing said oblique line, wherein
    a width R of said rectangles in said converting step is in a range Rw<R<Rp·m,
    wherein Rw is a resolution of a mask drawing apparatus, Rp is a resolution of a projection exposure apparatus and m is a magnification of a projection exposure apparatus.

10. A method of manufacturing a photomask according to claim 9, further comprising a step of selecting a low total number of rectangles when a plurality of methods of converting layout data of the circuit pattern of the polygon containing the oblique line are available.

11. A method of manufacturing a photomask according to claim 9, further comprising a step of selecting a low total number of minute rectangles when a plurality of methods of converting layout data of the circuit pattern of the polygon containing the oblique line are available.

12. A method of manufacturing a photomask according to claim 9, further comprising a step of selecting a smaller number of minute rectangles which form a rim of a polygon when a plurality of methods of converting layout data of the circuit pattern of the polygon containing the oblique line are available.

13. A method of testing and repairing a photomask wherein a defect is tested and repaired, said defect generated in a position on a line which corresponds to an oblique line of the photomask, said photomask provided with a transparent base and a shading pattern which displays a circuit pattern of a polygon containing an oblique line as a polygon in which a curved line is expressed in a stepwise manner by a plurality of rectangles, a width R of said rectangles being in a range Rw<R<Rp·m wherein
    said testing and repairing is performed on a curve by reference to layout data of said circuit pattern, Rw is a resolution power of a mask drawing device, Rp is a resolving power of a projection exposure device and m is a transcription ratio of a projection exposure device.

14. A method of manufacturing a semiconductor integrated circuit using a photomask provided with a transparent base and a shading pattern which displays a circuit pattern of a polygon containing an oblique line as a polygon in which said oblique line is expressed in a stepwise manner by a plurality of rectangles, a width R of said rectangles being in a range Rw<R<Rp·m, Rw is a resolution power of a mask drawing apparatus, Rp is a resolving power of a projection exposure apparatus and m is a magnification of a projection exposure apparatus.

15. A method according to claim 14, wherein a surface area of the polygon containing the oblique line is equal to a surface area of the polygon in which said oblique line is expressed in the stepwise manner.

16. A method according to claim 14, wherein an edge contacting with an end of said oblique line in the polygon containing the oblique line has a parallel relationship with an edge contacting with a position which corresponds to an end of said oblique line in the polygon in which said oblique line is expressed in the stepwise manner.

17. A method according to claim 14, wherein an edge contacting with an end of said oblique line in the polygon containing the oblique line has an orthogonal relationship with an edge contacting with a position which corresponds to an end of said oblique line in the polygon in which said oblique line is expressed in the stepwise manner.

18. A method according to claim 14, wherein when respective edges, each contacting with one end of said oblique line in the polygon containing the oblique line, are in a mutually parallel relationship, a step pattern which expresses said oblique line displays point symmetry with respect to a middle point of a line corresponding to said oblique line.

19. A method according to claim 14, wherein when respective edges, each contacting with one end of said oblique line in the polygon containing the oblique line, are in a mutually parallel relationship, a step pattern which expresses said oblique line displays mirror symmetry with respect to a vertical bisector of a line corresponding to said oblique line.

20. A method according to claim 14, wherein when respective edges, each contacting with one end of said oblique line in the polygon containing the oblique line, are in a mutually orthogonal relationship, a step pattern which expresses said oblique line displays point symmetry with respect to a middle point of a line corresponding to said oblique line.

21. A method according to claim 14, wherein when respective edges, each contacting with one end of said oblique line in the polygon containing the oblique line, are in a mutually orthogonal relationship, a step pattern which expresses said oblique line displays mirror symmetry with respect to a vertical bisector of a line corresponding to said oblique line.

22. A method of manufacturing a liquid crystal display using a photomask provided with a transparent base and a shading pattern which displays a circuit pattern of a polygon containing a oblique line as a polygon in which said oblique line is expressed in a stepwise manner by a plurality of rectangles, a width R of said rectangles being in a range $Rw<R<Rp \cdot m$, Rw is a resolution power of a mask drawing apparatus, Rp is a resolving power of a projection exposure apparatus and m is a magnification of a projection exposure apparatus.

* * * * *